US009490401B2

(12) United States Patent
Lee et al.

(10) Patent No.: US 9,490,401 B2
(45) Date of Patent: *Nov. 8, 2016

(54) METHOD OF MANUFACTURING LIGHT EMITTING DEVICE

(71) Applicant: Samsung Electronics Co., Ltd., Suwon-si (KR)

(72) Inventors: In Hyung Lee, Hanam-si (KR); Jong Won Park, Seoul (KR); Hyong Sik Won, Yongin-si (KR); Chul Soo Yoon, Suwon-si (KR); Dong Hoon Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/015,951

(22) Filed: Feb. 4, 2016

(65) Prior Publication Data
US 2016/0155909 A1    Jun. 2, 2016

Related U.S. Application Data

(63) Continuation of application No. 14/340,171, filed on Jul. 24, 2014, now Pat. No. 9,293,666.

(51) Int. Cl.
*H01L 33/00* (2010.01)
*H01L 33/50* (2010.01)
(Continued)

(52) U.S. Cl.
CPC .......... *H01L 33/502* (2013.01); *C09K 11/00* (2013.01); *H01L 25/0753* (2013.01); *H01L 33/486* (2013.01); *H01L 33/56* (2013.01); *H01L 33/60* (2013.01); *H05B 33/10* (2013.01);
(Continued)

(58) Field of Classification Search
None
See application file for complete search history.

(56) References Cited

U.S. PATENT DOCUMENTS 3,576,756 A    4/1971  Russo
5,729,925 A *  3/1998  Prothero ............... G09F 13/04
                                                    362/800

(Continued)

FOREIGN PATENT DOCUMENTS

EP    2527418 A1    11/2012
JP    2003-110151 A   4/2003
(Continued)

OTHER PUBLICATIONS

Office Action issued in U.S. Appl. No. 14/340,171 mailed Jul. 21, 2015.
(Continued)

*Primary Examiner* — Evren Seven
(74) *Attorney, Agent, or Firm* — Sughrue Mion, PLLC

(57) ABSTRACT

There is provided a method of manufacturing a light emitting device which includes preparing a light emitting element emitting excitation light and a substrate on which the light emitting element is disposed. A fluoride phosphor is provided to absorb excitation light emitted from the light emitting element to emit visible light, and is represented by Chemical Formula (1). The fluoride phosphor is disposed on at least one of the light emitting element and the substrate, wherein Chemical Formula (1): $A_xMF_y:Mn^{4+}$ (wherein $2 \leq x \leq 3$ and $4 \leq y \leq 7$, A is at least one element selected from the group consisting of Li, Na, K, Rb, and Cs, and M is at least one element selected from the group consisting Si, Ti, Zr, Hf, Ge, and Sn).

7 Claims, 26 Drawing Sheets

(51) Int. Cl.
*C09K 11/00* (2006.01)
*H05B 33/10* (2006.01)
*H01L 25/075* (2006.01)
*H01L 33/48* (2010.01)
*H01L 33/56* (2010.01)
*H01L 33/60* (2010.01)

(52) U.S. Cl.
CPC ........... *H01L2224/48091* (2013.01); *H01L 2224/48247* (2013.01); *H01L 2224/48257* (2013.01); *H01L 2924/181* (2013.01); *H01L 2933/005* (2013.01); *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |
| 7,084,420 | B2 | 8/2006 | Kim et al. |
| 7,087,932 | B2 | 8/2006 | Okuyama et al. |
| 7,154,124 | B2 | 12/2006 | Han et al. |
| 7,208,725 | B2 | 4/2007 | Sherrer et al. |
| 7,288,758 | B2 | 10/2007 | Sherrer et al. |
| 7,319,044 | B2 | 1/2008 | Han et al. |
| 7,497,973 | B2 | 3/2009 | Radkov et al. |
| 7,501,656 | B2 | 3/2009 | Han et al. |
| 7,648,649 | B2 | 1/2010 | Radkov et al. |
| 7,709,857 | B2 | 5/2010 | Kim et al. |
| 7,759,140 | B2 | 7/2010 | Lee et al. |
| 7,781,727 | B2 | 8/2010 | Sherrer et al. |
| 7,790,482 | B2 | 9/2010 | Han et al. |
| 7,847,309 | B2 | 12/2010 | Radkov et al. |
| 7,940,350 | B2 | 5/2011 | Jeong |
| 7,959,312 | B2 | 6/2011 | Yoo et al. |
| 7,964,881 | B2 | 6/2011 | Choi et al. |
| 7,985,976 | B2 | 7/2011 | Choi et al. |
| 7,994,525 | B2 | 8/2011 | Lee et al. |
| 8,008,683 | B2 | 8/2011 | Choi et al. |
| 8,013,352 | B2 | 9/2011 | Lee et al. |
| 8,049,161 | B2 | 11/2011 | Sherrer et al. |
| 8,129,711 | B2 | 3/2012 | Kang et al. |
| 8,179,938 | B2 | 5/2012 | Kim |
| 8,252,613 | B1* | 8/2012 | Lyons .................. C09K 11/617 438/45 |
| 8,263,987 | B2 | 9/2012 | Choi et al. |
| 8,324,646 | B2 | 12/2012 | Lee et al. |
| 8,399,944 | B2 | 3/2013 | Kwak et al. |
| 8,432,511 | B2 | 4/2013 | Jeong |
| 8,459,832 | B2 | 6/2013 | Kim |
| 8,502,242 | B2 | 8/2013 | Kim |
| 8,536,604 | B2 | 9/2013 | Kwak et al. |
| 2004/0229051 | A1* | 11/2004 | Schaepkens .......... C23C 14/022 428/447 |
| 2005/0212397 | A1* | 9/2005 | Murazaki ........... C09K 11/0883 313/487 |
| 2006/0068154 | A1* | 3/2006 | Parce .................... B82Y 20/00 428/76 |
| 2006/0237690 | A1 | 10/2006 | Tsuji et al. |
| 2007/0125984 | A1 | 6/2007 | Tian et al. |
| 2007/0170448 | A1* | 7/2007 | Ito ........................ H01L 33/58 257/98 |
| 2007/0176196 | A1* | 8/2007 | Kim ...................... H01L 33/50 257/99 |
| 2009/0072255 | A1 | 3/2009 | Takahashi et al. |
| 2010/0026164 | A1 | 2/2010 | Honda et al. |
| 2010/0041169 | A1* | 2/2010 | Lee .................... B29C 35/0888 438/26 |
| 2010/0060142 | A1* | 3/2010 | Itou ........................ B82Y 20/00 313/498 |
| 2010/0142189 | A1 | 6/2010 | Hong et al. |
| 2010/0181903 | A1* | 7/2010 | Kim ..................... H01L 51/5256 313/504 |
| 2010/0232134 | A1* | 9/2010 | Tran ........................ F21V 9/08 362/84 |
| 2010/0314993 | A1 | 12/2010 | Im et al. |
| 2011/0006334 | A1 | 1/2011 | Ishii et al. |
| 2011/0199788 | A1* | 8/2011 | Park ..................... G02B 6/0023 362/612 |
| 2011/0255265 | A1 | 10/2011 | Nammalwar et al. |
| 2012/0080705 | A1 | 4/2012 | Ohnishi et al. |
| 2012/0133268 | A1* | 5/2012 | Hwu ...................... F21K 9/30 313/489 |
| 2012/0256125 | A1 | 10/2012 | Kaneyoshi et al. |
| 2012/0261704 | A1 | 10/2012 | Meyer et al. |
| 2012/0267659 | A1* | 10/2012 | Chou ................... H01L 33/505 257/98 |
| 2012/0267661 | A1* | 10/2012 | Kim ..................... H01L 33/486 257/98 |
| 2012/0305972 | A1* | 12/2012 | Meyer ................. C09K 11/645 257/98 |
| 2013/0001444 | A1 | 1/2013 | Zhou et al. |
| 2013/0001628 | A1 | 1/2013 | Yamakawa et al. |
| 2013/0092914 | A1* | 4/2013 | Lifka ................... H01L 51/0021 257/40 |
| 2013/0264937 | A1 | 10/2013 | Sakuta et al. |
| 2014/0008697 | A1* | 1/2014 | Harkness .............. C08L 83/04 257/100 |
| 2014/0293609 | A1 | 10/2014 | Daimon et al. |
| 2014/0367633 | A1 | 12/2014 | Bibl et al. |
| 2015/0076406 | A1 | 3/2015 | Zhou et al. |
| 2015/0077966 | A1* | 3/2015 | Bessho ................ G02B 5/0242 362/19 |
| 2015/0301259 | A1* | 10/2015 | Park .................... G02B 6/0026 349/65 |

FOREIGN PATENT DOCUMENTS

| | | |
|---|---|---|
| JP | 2010-021085 A | 1/2010 |
| JP | 201 1-01 2091 A | 1/2011 |
| JP | 2012178574 A | 9/2012 |
| JP | 2012-530383 A | 11/2012 |
| KR | 10-2012-0035879 A | 4/2012 |
| KR | 10-2013-0027873 A | 3/2013 |

OTHER PUBLICATIONS

Notice of Allowance issued in U.S. Appl. No. 14/340,171 mailed Nov. 5, 2015.

* cited by examiner

METHOD OF MANUFACTURING LIGHT EMITTING DEVICE

CROSS-REFERENCE TO RELATED APPLICATION

This application is a continuation of U.S. application Ser. No. 14/340,171 filed Jul. 24, 2014, which claims the benefit of Korean Patent Application No. 10-2013-0153213 filed on Dec. 10, 2013, with the Korean Intellectual Property Office, the disclosures of which are incorporated herein by reference.

TECHNICAL FIELD

The present disclosure relates to a method of manufacturing a light emitting device.

BACKGROUND

Semiconductor light emitting elements, emitting light based on the recombination of electrons and electron holes when a current is applied thereto, are commonly used as light sources due to various advantages thereof such as low power consumption, high levels of luminance, compactness, and the like. In particular, after the development of nitride semiconductor light emitting elements, the utilization thereof has been greatly expanded and nitride semiconductor light emitting devices have been widely employed as light sources in backlight units, household lighting devices, vehicle illumination devices, and the like. A light emitting device using such a light emitting element may include a light emitting element providing excitation light and a phosphor excited by light emitted from the light emitting element to emit wavelength-converted light to implement desired color characteristics in emitted light. Thus, research into phosphors providing excellent characteristics in terms of color gamut, reliability, and the like, and a light emitting device using such a phosphor is required.

SUMMARY

An aspect of the present disclosure may provide a method of manufacturing a phosphor having improved optical properties and reliability.

An aspect of the present disclosure may also provide a light emitting device using the above-described phosphor and a manufacturing method thereof.

However, objects of the present disclosure are not limited thereto and objects and effects that may be recognized from technical solutions or embodiments described hereinafter may also be included although not explicitly mentioned.

According to an aspect of the present disclosure, a method of manufacturing a light emitting device may include: preparing a light emitting element emitting excitation light and a substrate on which the light emitting element is disposed; preparing a fluoride phosphor absorbing excitation light emitted from the light emitting element to emit visible light, represented by Chemical Formula (1); and disposing the fluoride phosphor on at least one of the light emitting element and the substrate, wherein the preparing of the fluoride phosphor represented by Chemical Formula (1) includes: preparing a first aqueous solution including at least one of $K_2MnF_6$ and $Na_2MnF_6$; forming a first precipitate using the first aqueous solution, a first raw material containing M and a second raw material containing A; washing the first precipitate with at least a 40 wt % hydrofluoric acid aqueous solution; and drying the washed first precipitate.

$$A_xMF_y:Mn^{4+} \quad \text{Chemical Formula (1)}$$

(wherein $2 \leq x \leq 3$ and $4 \leq y \leq 7$, A is at least one element selected from the group consisting of Li, Na, K, Rb, and Cs, and M is at least one element selected from the group consisting Si, Ti, Zr, Hf, Ge, and Sn).

The preparing of a first aqueous solution may include: dissolving $KHF_2$ powder or $NaHF_2$ powder and $KMnO_4$ powder or $NaMnO_4$ powder in the hydrofluoric acid aqueous solution; adding hydrogen peroxide to the product generated by the dissolving operation to form a second precipitate; and stirring the second precipitate in the hydrofluoric acid aqueous solution to remove the $KHF_2$ powder or $NaHF_2$ powder remaining in the second precipitate.

The first aqueous solution may be a first hydrofluoric acid aqueous solution having at least one of $KMnF_6$ and $NaMnF_6$ dissolved therein.

The forming of a first precipitate may include: stirring the first raw material in the first hydrofluoric acid aqueous solution; adding the second raw material to the product generated by the stirring operation to form the first precipitate.

The phosphor represented by Chemical Formula (1) may have an absorption rate equal to or greater than 0.75, internal quantum efficiency equal to or greater than 0.75, and external quantum efficiency equal to or greater than 0.65, with respect to excitation light having a wavelength of 450 nm.

The method may further include: coating surfaces of phosphor particles represented by Chemical Formula (1) with at least one of a silicon oxide and a metal oxide, after the drying operation.

The coating may include: preparing an alcohol-based solvent with a polymer dissolved therein; stirring the prepared alcohol-based solvent and the phosphor represented by Chemical Formula (1); adding a basic aqueous solution including at least one of a silicon oxide precursor and a metal oxide precursor to the stirred product and stirring the same to form a third precipitate; and heating the third precipitate.

The method may further include: coating surfaces of the phosphor particles represented by Chemical Formula (1) with an organic substance, after the drying operation.

The coating may include: mixing the phosphor represented by Chemical Formula (1) in an organic solvent; adding an organic precursor to the mixing product, and stirring the same to form a fourth precipitate; and washing the fourth precipitate.

The substrate may have a first surface on which the light emitting element is mounted, the method may further include: mounting the light emitting element on the first surface of the substrate, and the disposing of the fluoride phosphor on at least one of the light emitting element and the substrate may include: forming a lower filler on the first substrate of the substrate on which the light emitting element is mounted; forming a wavelength converter on the lower filler such that the wavelength converter is separated from the first surface by the lower filler, the wavelength converter including the prepared fluoride phosphor; and disposing a cover on the wavelength converter, wherein the wavelength converter is sealed by at least one of the substrate, the lower filler, and the cover.

The lower filler may be a first resin layer including a resin.

The wavelength converter may include the phosphor and a second resin layer having the phosphor dispersed therein, wherein resin materials constituting the first and second resin layers may have different refractive indices.

The resin material of the first resin layer may have a refractive index greater than that of the resin material of the second resin layer.

The method may further include forming a moisture-proof coating on the first surface of the substrate, before the disposing of the lower filler.

The moisture-proof coating may include at least one of a fluorine-based and a silica-based coating agent.

The cover may be formed of a material including glass.

In the forming of the cover, the cover may be formed on the upper surface and the lateral surfaces of the wavelength converter to cover the upper surface and the lateral surfaces of the wavelength converter.

The lower filler and the cover may be formed of an inorganic substance.

The forming of the cover may include: disposing a first cover disposed on the wavelength converter; and disposing a second cover including a resin on the first cover.

The second cover may include first and second layers having different refractive indices.

The first layer may include methyl-based silicone and the second layer may include phenyl-based silicone.

The light emitting element may include a first light emitting element and a second light emitting element connected to the first light emitting element in a reverse-polarity manner, and the first and second light emitting elements may alternately emit light upon receiving external alternating current (AC) power.

According to an aspect of the present disclosure, a method of manufacturing a light emitting device may include: preparing a light emitting element emitting excitation light and a substrate on which the light emitting element is mounted; preparing a fluoride phosphor absorbing excitation light emitted from the light emitting element to emit visible light, represented by Chemical Formula (1); and disposing the fluoride phosphor on at least one of the light emitting element and the substrate, wherein the preparing of the fluoride phosphor represented by Chemical Formula (1) includes: preparing a first aqueous solution including at least one of $K_2MnF_6$ and $Na_2MnF_6$; forming a first precipitate using the first aqueous solution, a first raw material containing M and a second raw material containing A; drying the first precipitate; and coating surfaces of particles of the dried first precipitate with at least one of a silicon oxide, a metal oxide, and an organic substance.

$$A_xMF_y:Mn^{4+} \qquad \text{Chemical Formula (1)}$$

(wherein 2≤x≤3 and 4≤y≤7, A is at least one element selected from the group consisting of Li, Na, K, Rb, and Cs, and M is at least one element selected from the group consisting Si, Ti, Zr, Hf, Ge, and Sn).

According to an aspect of the present disclosure, a method of manufacturing a light emitting device may include: disposing a light emitting element emitting excitation light to a substrate having a first surface; disposing a lower filler on the first surface of the substrate on which the light emitting element is mounted; and disposing a wavelength converter on the lower filler such that the wavelength converter is separated from the first surface of the substrate by the lower filler; and disposing a cover on the wavelength converter, wherein the wavelength converter is sealed by at least one of the substrate, the lower filler, and the cover, and the wavelength converter includes a fluoride phosphor represented by Chemical Formula (1).

$$A_xMF_y:Mn^{4+} \qquad \text{Chemical Formula (1)}$$

(wherein 2≤x≤3 and 4≤y≤7, A is at least one element selected from the group consisting of Li, Na, K, Rb, and Cs, and M is at least one element selected from the group consisting Si, Ti, Zr, Hf, Ge, and Sn).

According to an aspect of the present disclosure, a method of manufacturing a light emitting device may include: preparing first and second light emitting element arrays emitting excitation light; connecting the first and second light emitting element arrays in a reverse-polarity manner; and disposing a wavelength converter in a light path of excitation light emitted from the first and second light emitting element arrays to absorb excitation light emitted from the first and second light emitting element arrays to emit visible light, wherein the first and second light emitting element arrays alternately emit light upon receiving external alternating current (AC) power, and the wavelength converter includes a fluoride phosphor represented by Chemical Formula (1).

$$A_xMF_y:Mn^{4+} \qquad \text{Chemical Formula (1)}$$

(wherein 2≤x≤3 and 4≤y≤7, A is at least one element selected from the group consisting of Li, Na, K, Rb, and Cs, and M is at least one element selected from the group consisting Si, Ti, Zr, Hf, Ge, and Sn).

According to an aspect of the present disclosure, a method of preparing a fluoride phosphor represented by Chemical Formula (1) may include: preparing a first aqueous solution including at least one of $K_2MnF_6$ and $Na_2MnF_6$; forming a first precipitate using the first aqueous solution, a first raw material containing M and a second raw material containing A; washing the first precipitate with at least a 40 wt % hydrofluoric acid aqueous solution; and drying the washed first precipitate.

$$A_xMF_y:Mn^{4+} \qquad \text{Chemical Formula (1)}$$

(wherein 2≤x≤3 and 4≤y≤7, A is at least one element selected from the group consisting of Li, Na, K, Rb, and Cs, and M is at least one element selected from the group consisting Si, Ti, Zr, Hf, Ge, and Sn).

The preparing of a first aqueous solution may include: dissolving $KHF_2$ powder or $NaHF_2$ powder and $KMnO_4$ powder or $NaMnO_4$ powder in the hydrofluoric acid aqueous solution; adding hydrogen peroxide to the product generated by the dissolving operation to form a second precipitate; and stirring the second precipitate in the hydrofluoric acid aqueous solution to remove the $KHF_2$ powder or $NaHF_2$ powder remaining in the second precipitate.

The first aqueous solution may be a first hydrofluoric acid aqueous solution having at least one of $KMnF_6$ and $NaMnF_6$ dissolved therein.

The forming of a first precipitate may include: stirring the first raw material in the first hydrofluoric acid aqueous solution; adding the second raw material to the product generated by the stirring operation to form the first precipitate.

The phosphor represented by Chemical Formula (1) may have an absorption rate equal to or greater than 0.75, internal quantum efficiency equal to or greater than 0.75, and external quantum efficiency equal to or greater than 0.65, with respect to excitation light having a wavelength of 450 nm.

The method may further include: coating surfaces of phosphor particles represented by Chemical Formula (1) with at least one of a silicon oxide and a metal oxide, after the drying operation.

The metal oxide may be an inorganic substance of at least one compound selected from the group consisting of $Al_2O_3$, ZnO, and $TiO_2$.

The coating may include: preparing an alcohol-based solvent with a polymer dissolved therein; stirring the prepared alcohol-based solvent and the phosphor represented by Chemical Formula (1); and adding a basic aqueous solution including at least one of a silicon oxide precursor and a metal oxide precursor to the stirred product and stirring the same to form a third precipitate; and heating the third precipitate.

The method may further include: coating surfaces of the phosphor particles represented by Chemical Formula (1) with an organic substance, after the drying operation.

The coating may include: mixing the phosphor represented by Chemical Formula (1) in an organic solvent; adding an organic precursor to the product generated by the mixing operation, and stirring the same to form a fourth precipitate; and washing the fourth precipitate.

According to an aspect of the present disclosure, a method of preparing a fluoride phosphor represented by Chemical Formula (1) may include: preparing a first aqueous solution including at least one of $K_2MnF_6$ and $Na_2MnF_6$; forming a first precipitate using the first aqueous solution, a first raw material containing M and a second raw material containing A; drying the first precipitate; and coating surfaces of particles of the dried first precipitate with at least one of a silicon oxide, a metal oxide, and an organic substance.

$$A_xMF_y:Mn^{4+} \quad \text{Chemical Formula (1)}$$

(wherein 2≤x≤3 and 4≤y≤7, A is at least one element selected from the group consisting of Li, Na, K, Rb, and Cs, and M is at least one element selected from the group consisting Si, Ti, Zr, Hf, Ge, and Sn).

According to an aspect of the present disclosure, a light emitting device may include: a substrate having a first surface; a light emitting element disposed on the first surface of the substrate and emitting excitation light; a wavelength converter absorbing the excitation light to emit visible light; a lower filler filling a space between the wavelength converter and the first surface of the substrate to separate the wavelength converter and the substrate; and a cover formed on the wavelength converter, wherein the wavelength converter is sealed by at least one of the substrate, the lower filler, and the cover and includes a fluoride phosphor represented by Chemical Formula (1).

$$A_xMF_y:Mn^{4+} \quad \text{Chemical Formula (1)}$$

(wherein 2≤x≤3 and 4≤y≤7, A is at least one element selected from the group consisting of Li, Na, K, Rb, and Cs, and M is at least one element selected from the group consisting Si, Ti, Zr, Hf, Ge, and Sn).

The lower filler may be a first resin layer including a resin.

The wavelength converter may include the phosphor and a second resin layer having the phosphor dispersed therein, wherein resin materials constituting the first and second resin layers may have different refractive indices.

The resin material of the first resin layer may have a refractive index greater than that of the resin material of the second resin layer.

The substrate may further include a moisture-proof coating disposed on the first surface.

The moisture-proof coating may include at least one of a fluorine-based and a silica-based coating agent.

The cover may be formed of a material including glass.

The cover may be disposed to cover the upper surface and the lateral surfaces of the wavelength converter.

The lower filler and the cover may be formed of an organic substance.

The cover may include a first cover disposed on the wavelength converter and a second cover disposed on the first cover and including a resin.

The second cover may include first and second layers having different refractive indices.

The first layer may include methyl-based silicone and the second layer may include phenyl-based silicone.

The light emitting element may include a first light emitting element and a second light emitting element connected to the first light emitting element in a reverse-polarity manner, and the first and second light emitting elements may alternately emit light upon receiving external alternating current (AC) power.

According to an aspect of the present disclosure, a light emitting device may include: a first light emitting element array emitting excitation light; a light emitting element array emitting excitation light and connected to the first light emitting element array in a reverse-polarity manner; and a wavelength converter absorbing excitation light emitted from the first and second light emitting element arrays to emit visible light, wherein the first and second light emitting element arrays alternately emit light upon receiving external alternating current (AC) power, and the wavelength converter includes a fluoride phosphor represented by Chemical Formula (1).

$$A_xMF_y:Mn^{4+} \quad \text{Chemical Formula (1)}$$

(wherein 2≤x≤3 and 4≤y≤7, A is at least one element selected from the group consisting of Li, Na, K, Rb, and Cs, and M is at least one element selected from the group consisting Si, Ti, Zr, Hf, Ge, and Sn).

The foregoing technical solutions do not fully enumerate all of the features of the present disclosure. The foregoing and other objects, features, aspects and advantages of the present disclosure will become more apparent from the above detailed description of the present disclosure when taken in conjunction with the accompanying drawings.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
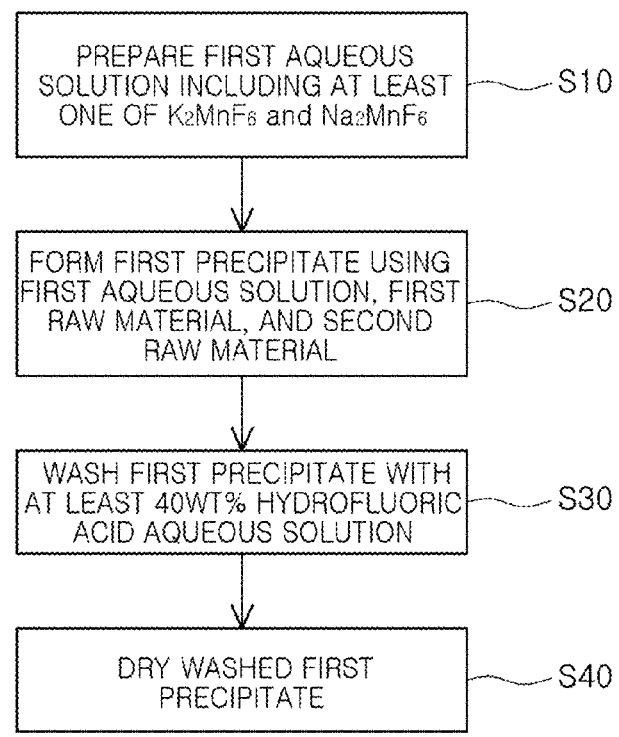
FIG. 1 is a flow chart illustrating a method of preparing a phosphor according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a flow chart illustrating a method of preparing a phosphor according to an exemplary embodiment of the present disclosure.

A phosphor prepared according to the present exemplary embodiment is a fluoride phosphor represented by Chemical Formula (1), in which M may be at least one element selected from the group consisting of silicon Si, Ti, Zr, Hf, Ge, and Sn, and A may be at least one element selected from the group consisting of Li, Na, K, Rb, and Cs.

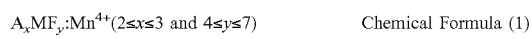

$A_xMF_y:Mn^{4+}(2 \le x \le 3 \text{ and } 4 \le y \le 7)$    Chemical Formula (1)

The fluoride phosphor represented by Chemical Formula (1) may be, for example, KSF-based phosphor and may include $K_2SiF_6:Mn^{4+}$.

The phosphor may be prepared by using a first aqueous solution including at least one $K_2MnF_6$ and $Na_2MnF_6$, a first raw material containing M, and a second raw material containing A.

This will be described in detail with reference to FIG. 1 hereinafter.

Referring to FIG. 1, a method for preparing a phosphor according to the present exemplary embodiment may include: operation S10 of preparing a first aqueous solution including at least one of $K_2MnF_6$ and $Na_2MnF_6$. Operation S20 includes forming a first precipitate using the first aqueous solution, a first raw material containing M, and a second raw material containing A. Operation S30 includes washing the first precipitate with at least a 40 wt % hydrofluoric acid aqueous solution. Operation S40 includes drying the washed first precipitate.

Operation S10 of preparing the first aqueous solution may be performed by preparing $K_2MnF_6$ or $Na_2MnF_6$ and subsequently dissolving $K_2MnF_6$ or $Na_2MnF_6$ in an aqueous solution.

In detail, $K_2MnF_6$ or $Na_2MnF_6$ may be prepared by dissolving $KHF_2$ powder or $NaHF_2$ powder and $KMnO_4$ powder or $NaMnO_4$ powder in a hydrofluoric acid aqueous solution by stirring the same, adding hydrogen peroxide to the product to form a second precipitate; and stirring the second precipitate in a hydrofluoric acid aqueous solution to remove $KHF_2$ powder or $NaHF_2$ powder remaining in the second precipitate. The $KHF_2$ powder or $NaHF_2$ powder may be mixed with the $KMnO_4$ powder or $NaMnO_4$ powder in a ratio of 10:1 and stirred in the hydrofluoric acid aqueous solution so as to be dissolved, but the present disclosure is not limited thereto.

Figure 2:
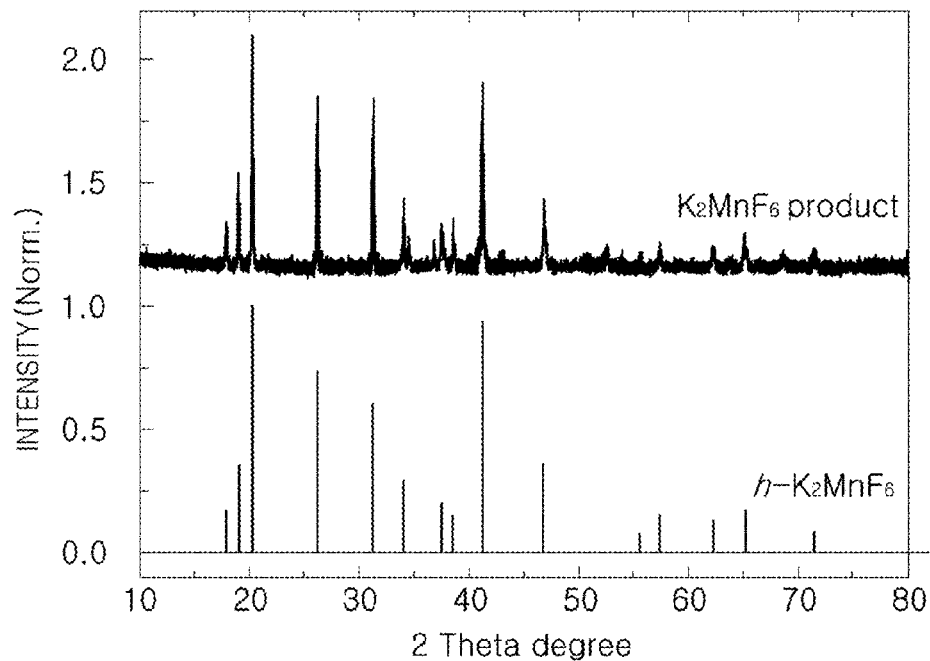
FIG. 2 is a graph illustrating an XRD pattern of materials $K_2MnF_6$ and $h\text{-}K_2MnF_6$ prepared according to an example of the present exemplary embodiment.

For example, the inventors of the present application dissolved 0.5 mol of $KHF_2$ powder and 0.05 mol of $KMnO_4$ in a 49 wt % hydrofluoric acid aqueous solution, while stirring the same, and slowly applying 6 ml of 30 wt % hydrogen peroxide aqueous solution to the product dropwise, to confirm that a yellow solution was precipitated (second precipitate). After the reaction was completed, supernatant was removed, the second precipitate was stirred in 70 ml of 49 wt % hydrofluoric acid aqueous solution for five minutes to remove $KHF_2$ remaining in the second precipitate. It can be seen that an XRD pattern of the obtained product is 99% identical to that of h-$K_2MnF_6$ as illustrated in FIG. 2.

Thereafter, the obtained $K_2MnF_6$ or $Na_2MnF_6$ may be dissolved in an aqueous solution to prepare a first aqueous solution. Here, the aqueous solution dissolving $K_2MnF_6$ or $Na_2MnF_6$ may be a hydrofluoric acid aqueous solution, and in this case, the first aqueous solution may be understood as a first hydrofluoric acid aqueous solution.

In detail, the inventors of the present application completely dissolved 1.2 mmol of $K_2MnF_6$ in a 480 ml of a hydrofluoric acid aqueous solution to prepare a first hydrofluoric acid aqueous solution (first aqueous solution).

Next, when the first aqueous solution is prepared, a first precipitate may be formed using the first aqueous solution, the first raw material containing M and the second raw material containing A (S20).

The first raw material is a compound including M. In an example of the present exemplary embodiment, when M is silicon (Si), the first raw material may be an aqueous solution including, for example, $H_2SiF_6$. The second raw material may be a metal or compound including A, and in an example of the present exemplary embodiment, when A is potassium (K), the second raw material may be an aqueous solution including $KHF_2$.

In an example, the inventors mixed 7.2 mmol of 34% of $H_2SiF_6$ aqueous solution (first raw material) in the first hydrofluoric acid aqueous solution prepared in operation S10 and stirred the mixture for approximately 20 minutes to 30 minutes, and slowly applied 86.4 mmol of $KHF_2$ saturated aqueous solution (second raw material) dropwise to confirm that an orange precipitate (first precipitate) was formed.

Thereafter, when the first precipitate is formed, the first precipitate is washed with a high concentration hydrofluoric acid aqueous solution (S30). Here, the inventors discovered that washing with low concentration hydrofluoric acid aqueous solution, such as 20 wt % or less hydrofluoric acid aqueous solution damages phosphors due to moisture vulnerability of the fluoride phosphor represented by Chemical Formula (1).

Table 1 shows experimental data obtained by measuring the absorption rates, internal quantum efficiency, and external quantum efficiency of a fluoride phosphor obtained without washing a first precipitate with a hydrofluoric acid aqueous solution; and a fluoride phosphor obtained by washing a first precipitate with a hydrofluoric acid aqueous solution by varying concentration of the hydrofluoric acid aqueous solution.

In detail, in Experimental Example 1A, the first precipitate was not washed, and in the case of Experimental Examples 1B to 1G, the first precipitate was washed with a hydrofluoric acid aqueous solution including hydrofluoric acid set to have a concentration of 20 wt %, 30 wt %, 35 wt %, 40 wt %, 44 wt % and 48 wt %, respectively.

TABLE 1

|  | Absorption rate | Internal quantum efficiency | External quantum efficiency |
| --- | --- | --- | --- |
| Experimental Example 1A | 0.679 | 0.887 | 0.615 |
| Experimental Example 1B | 0.649 | 0.605 | 0.401 |
| Experimental Example 1C | 0.691 | 0.710 | 0.501 |
| Experimental Example 1D | 0.728 | 0.743 | 0.552 |
| Experimental Example 1E | 0.689 | 0.882 | 0.620 |
| Experimental Example 1F | 0.697 | 0.907 | 0.645 |
| Experimental Example 1G | 0.699 | 0.892 | 0.637 |

Referring to Table 1, it can be seen that washing the first precipitate with a 20 wt % or less hydrofluoric acid aqueous solution (Experimental Example 1B) damaged the fluoride phosphor due to moisture vulnerability thereof, and external quantum efficiency was merely 0.401. Meanwhile, it can be seen that the use of a 40 wt % or more hydrofluoric acid aqueous solution caused minor damage to the fluoride phosphor, effectively removed impurities existing on a surface of the fluoride phosphor, and had high external quantum efficiency of 0.620.

Thus, the inventors of the present application propose that the high concentration hydrofluoric acid aqueous solution used for washing is at least a 40 wt % hydrofluoric acid aqueous solution. The washing process may be performed by stirring the first precipitate with the high concentration hydrofluoric acid aqueous solution, by which impurities, residual first and second raw materials, and the like, may be removed.

Thereafter, the washed first precipitate is dried (S40) to obtain the fluoride phosphor represented by the foregoing Chemical Formula (1). In an exemplary embodiment, after the washing operation S40 of washing the first precipitate with a high concentration hydrofluoric acid aqueous solution, secondary washing may be performed with a ketone-based solvent or an alcohol-based solvent before drying the washed first precipitate.

Hereinafter, the phosphor will be described in detail with reference to specific Embodiment Examples and Comparative Examples according to the preparation method thereof.

EMBODIMENT EXAMPLE 1

The inventors of the present application washed the first precipitate obtained in the above process with a 49 wt % hydrofluoric acid aqueous solution and secondarily washed with acetone. In detail, 49% hydrofluoric acid aqueous solution was applied in the ratio of 6 ml per 1 g of the first precipitate and stirred for approximately 1 minute, and thereafter, 99.9% of acetone solvent was added in an amount of 20 ml per 1 g of the first precipitate to perform washing for about 5 minutes.

The inventors of the present application repeatedly performed the washing operation using the high concentration hydrofluoric acid aqueous solution and acetone solvent three times, and dried the washed first precipitate to obtain a fluoride phosphor expressed by $K_2SiF_6:Mn^{4+}$.

Comparative Example 1A

In Comparative Example 1A, the first precipitate formed in the foregoing process was washed with ethanol through ultrasonic washing, and dried to prepare a fluoride phosphor expressed by $K_2SiF_6:Mn^{4+}$. Namely, in Comparative Example 1A, the ethanol ultrasonic washing process, rather than a process of washing the high concentration hydrofluoric acid, was performed, and the other specific processes were performed in substantially the same manner as that of Embodiment Example 1.

Comparative Example 1B

In Comparative Example 1B, the first precipitate formed in the foregoing process, without undergoing both the high concentration hydrofluoric acid aqueous solution and ethanol ultrasonic washing processes, was dried to prepare a fluoride phosphor expressed by $K_2SiF_6:Mn^{4+}$. Namely, in Comparative Example 1B, the other specific processes, excluding the process of washing with the high concentration hydrofluoric acid aqueous solution, were performed in substantially the same manner as that of Embodiment Example 1.

Table 2 displays information regarding absorption rate, internal quantum efficiency, external quantum efficiency, peak wavelength, and full width at half maximum (FWHM) of the phosphors prepared according to Embodiment Example 1, Comparative Example 1A, and Comparative Example 1B, respectively. Here, blue light having a wavelength of 450 nm was used as excitation light to excite each phosphor, and QE-1000 (Otsuka Electronics, Japan) was used as measurement equipment.

TABLE 2

| | Absorption rate | Internal quantum efficiency | External quantum efficiency | Peak wavelength | FWHM |
|---|---|---|---|---|---|
| Embodiment Example 1 | 0.833 | 0.794 | 0.661 | 631.788 | 15.143 |
| Comparative Example 1A | 0.791 | 0.794 | 0.628 | 631.788 | 15.133 |
| Comparative Example 1B | 0.805 | 0.777 | 0.625 | 631.788 | 15.126 |

Referring to Table 2, it can be seen that the phosphor according to Embodiment Example 1 has an absorption ratio and internal quantum efficiency higher than those of Comparative Example 1A and Comparative Example 1B, and although a peak wavelength and FWHM of the phosphor according to Embodiment Example 1 are substantially equal, external quantum efficiency expressed by the product of absorption rate and the internal quantum efficiency is 3% to 4% higher than those of Comparative Example 1A and Comparative Example 1B.

In general, when washing phosphor with a high concentration hydrofluoric acid aqueous solution damages surfaces of the particle; however, the phosphor represented by Chemical Formula (1) according to this embodiment contains fluorine (F), so although it is washed with a high concentration hydrofluoric acid aqueous solution, a surface of the phosphor particle is rarely damaged, and it was ascertained that washing the phosphor with a 40 wt % or more hydrofluoric acid aqueous solution significantly improved the surface of the phosphor particle.

Figure 3A:
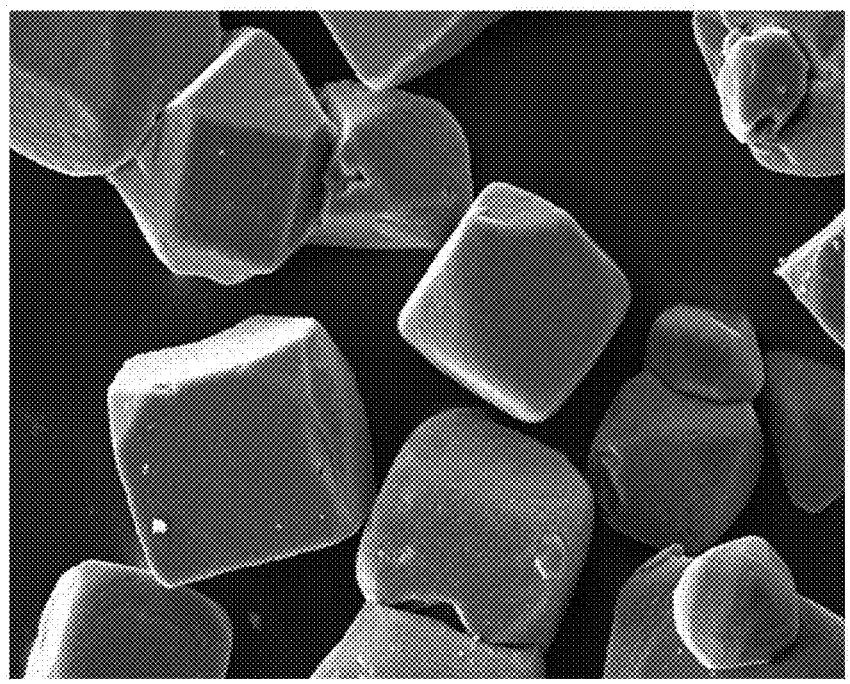
FIGS. 3A and 3B are scanning electron microscope (SEM) photographs of phosphors obtained according to Embodiment of the present disclosure and Comparative Example.
Figure 3B:
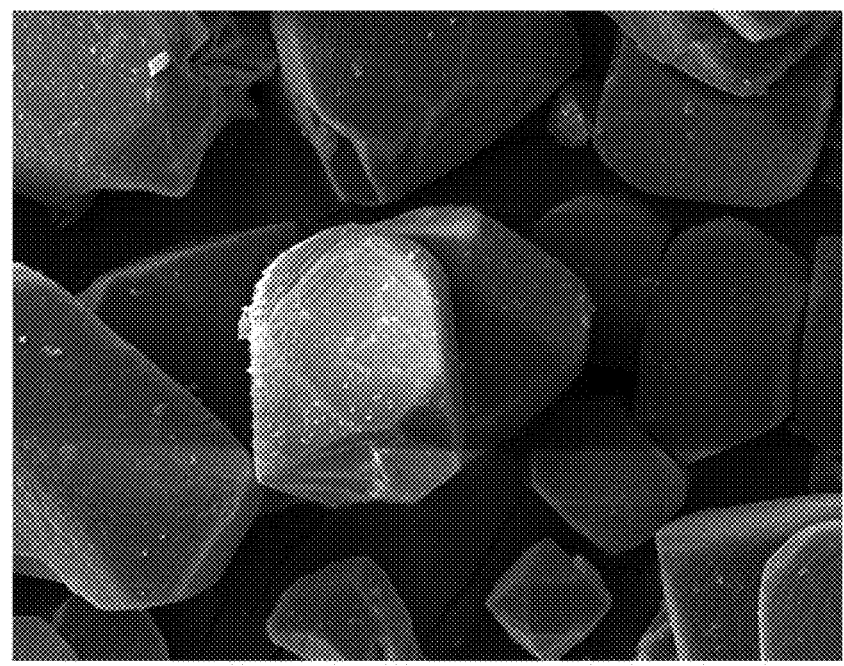

FIGS. 3A and 3B are scanning electron microscope (SEM) photographs of phosphors obtained according to Embodiment of the present disclosure and Comparative Example.

Referring to FIG. 3A, it can be seen that the phosphor represented by Chemical Formula (1) had cubic particles and impurities thereof were significantly removed through the washing process using the high concentration hydrofluoric acid aqueous solution, compared to the surfaces of phosphor particles illustrated in FIG. 3B.

Figure 4:
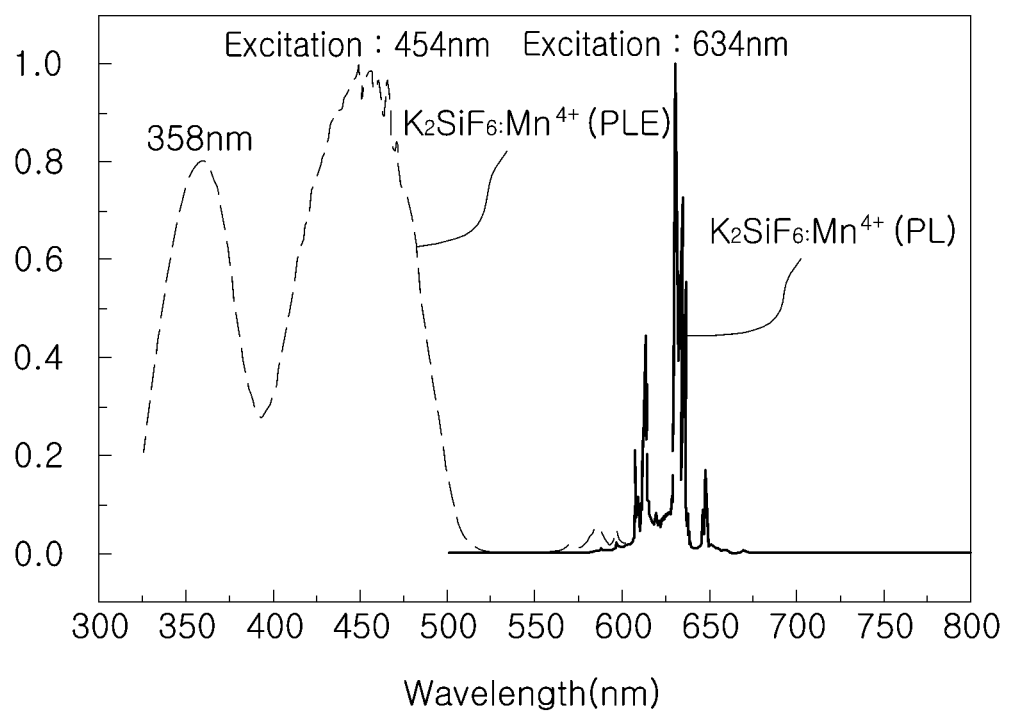
FIG. 4 is a graph illustrating a photoluminescence excitation (PLE) spectrum and photoluminescence (PL) spectrum of a phosphor prepared according to an exemplary embodiment of the present disclosure.

FIG. 4 is a graph illustrating a photoluminescence excitation (PLE) spectrum and photoluminescence (PL) spectrum of a phosphor prepared according to an exemplary embodiment of the present disclosure. Referring to FIG. 4, it was ascertained that the phosphor has high excitation efficiency at 454 nm and has an emission spectrum of 634 nm corresponding to a red wavelength band.

Hereinafter, an improved color gamut (or color reproduction) of a white light emitting device using the phosphor prepared according to the present exemplary embodiment will be described with reference to FIG. 5.

First, in order to display a sharp contrast in improved characteristics, white light emitting devices were configured as described hereinbelow, and each of those devices included a light emitting element basically emitting blue light (dominant wavelength: 446 nm) as excitation light and green and red phosphors absorbing the excitation light emitted from the light emitting element to emit visible light.

EMBODIMENT EXAMPLE 2

A white light emitting device was configured to include a light emitting element emitting blue light (dominant wavelength 446 nm) and green and red phosphors. The green phosphor was a β-SiAlON phosphor having a peak wavelength of 533 nm, and a fluoride phosphor prepared after being washed with a high concentration hydrofluoric acid aqueous solution according to the foregoing embodiment (Embodiment 1) and represented by Chemical Formula (1) was used as the red phosphor.

Comparative Example 2A

A white light emitting device was configured to include a light emitting element emitting blue light (dominant wavelength: 446 nm), a light emitting element emitting a green light (dominant wavelength: 517 nm), and a red phosphor. A CaAlSiN:Eu-based phosphor having a peak wavelength of 650 nm was used as the red phosphor.

Comparative Example 2B

A white light emitting device was configured to include a light emitting element emitting blue light (dominant wavelength: 446 nm), and green and red phosphors. The red phosphor was a β-SiAlON phosphor having a peak wavelength of 533 nm, and a CaAlSiN:Eu-based phosphor having a peak wavelength of 650 nm was used as the red phosphor.

Table 3 displays color characteristics of white light emitted from the white light emitting devices according to Embodiment Example 2, Comparative Example 2A, and Comparative Example 2B.

TABLE 3

| | Embodiment Example 2 | Comparative Example 2A | Comparative Example 2B |
|---|---|---|---|
| Luminous efficacy (lm/w) | 237.8100 | 145.84 | 185.65 |
| NTSC area percentage | 89.4% | 94.3% | 86.2% |
| sRGB area percentage | 125.6% | 133.2% | 121.7% |
| sRGB concordance rate | 99.95% | 94.49% | 99.79% |
| Adobe concordance rate | 85.51% | 88.52% | 82.19% |
| Adobe area percentage | 93.57% | 98.71% | 90.22% |

Figure 5:
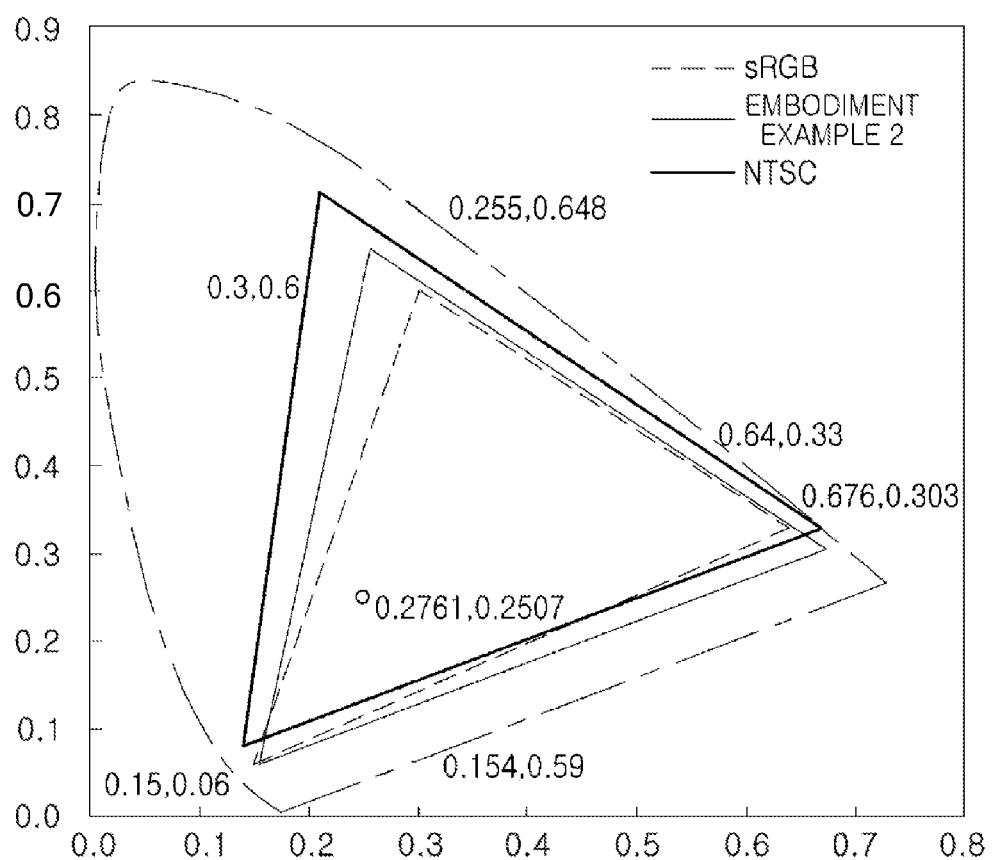
FIG. 5 is the CIE 1931 color chromaticity diagram illustrating color characteristics obtained by a white light emitting device employing phosphors according to an exemplary embodiment of the present disclosure.

FIG. 5 is the CIE 1931 color chromaticity diagram illustrating color characteristics obtained by white light emitting device employing phosphors according to Embodiment Example 2.

Referring to Table 3 together with FIG. 5, it can be seen that the use of the phosphor according to Embodiment Example 2 obtained a luminous efficacy approximately 28% to 60% higher than those of Comparative Example 2A and Comparative Example 2B, and the white light emitting device according to Embodiment Example 2 had improved color characteristics in evaluation of a high color gamut such as NTSC, sRGB, Adobe, and the like.

Figure 6:
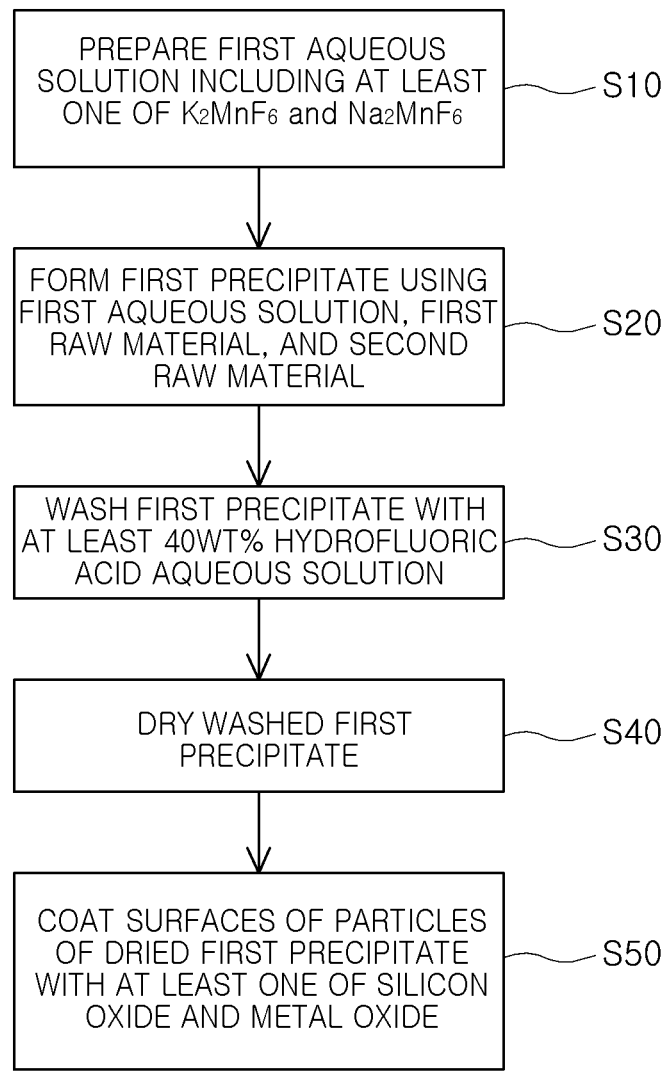
FIGS. 6 and 7 are flow charts illustrating a method of preparing a phosphor according to an exemplary embodiment of the present disclosure.

Meanwhile, as illustrated in FIG. 6, the method of preparing a phosphor according to the present exemplary embodiment may further include operation S50 which includes coating the surface of the fluoride phosphor particle, prepared by washing the first precipitate (S30) and drying the leaned first precipitate (S40) and represented by Chemical Formula (1), with at least one of a silicon oxide and a metal oxide.

The silicon oxide may be, for example, $SiO_2$, and the metal oxide may be at least one element of inorganic substance selected from the group consisting of $Al_2O_3$, ZnO, and $TiO_2$, but the present disclosure is not limited thereto.

The coating of a silicon oxide may include preparing an alcohol-based solvent with a polymer dissolved therein, stirring the prepared alcohol-based solvent and the phosphor represented by Chemical Formula (1), adding a basic aqueous solution including a silicon oxide precursor to the stirred product and stirring the same to form a third precipitate, and heating the third precipitate.

In the present exemplary embodiment, the polymer may be provided as a medium connecting surfaces or phosphors and oxygen particles of the silicon oxide, and may be formed of a material such as polyvinyl pyrrolidone, polystyrene, or polymethylmethacrylate.

The coating of a metal oxide may include preparing an alcohol-based solvent with a polymer dissolved therein, stirring the prepared alcohol-based solvent and the phosphor represented by Chemical Formula (1), adding a basic aqueous solution including a silicon oxide precursor to the stirred product and stirring the same to form a third precipitate, and heating the third precipitate.

In particular, the fluoride phosphor represented by Chemical Formula (1) is vulnerable to moisture and thus not greatly reliable when applied to a product, but in case of the present exemplary embodiment, since the surfaces of fluoride phosphor particles represented by Chemical Formula (1) are coated with a silicon oxide and/or metal oxide, ambient moisture may be effectively blocked and reliability may be improved.

Figure 8A:
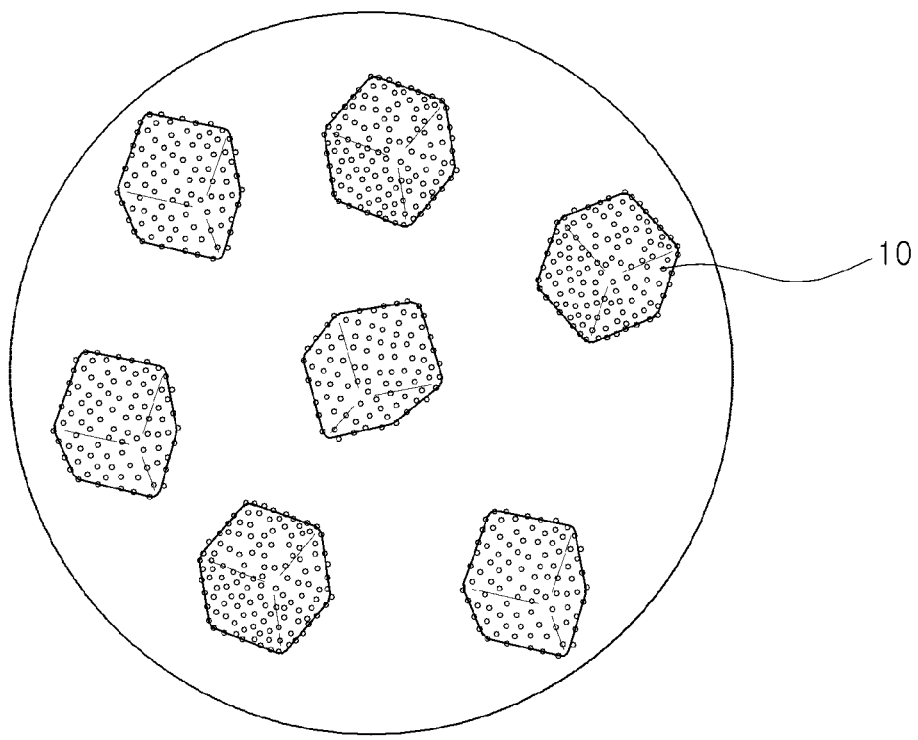
FIGS. 8A through 8C are views schematically illustrating phosphors with coated particle surfaces according to an exemplary embodiment of the present disclosure.
Figure 8B:
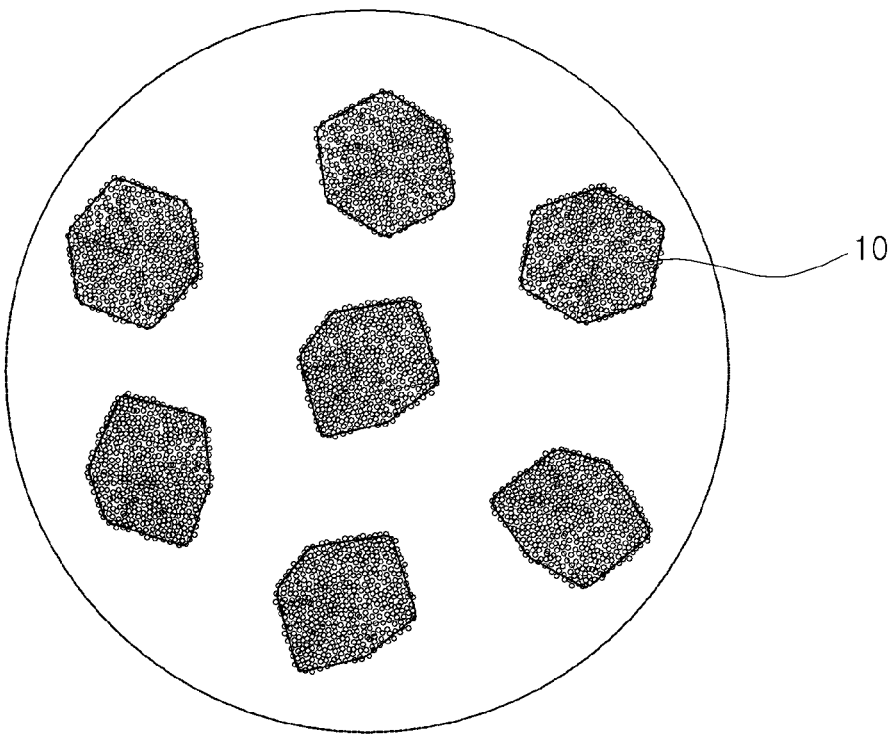

In this case, by appropriately altering conditions such as concentration of the silicon oxide precursor and/or metal oxide precursor used for silicon oxide and/or metal oxide coating, pH of the basic aqueous solution, a reaction temperature, a reaction time, and the like, the surfaces of the fluoride phosphor 10 particles may be coated by applying the silicon oxide and/or metal oxide thereto in a scattered manner as illustrated in FIG. 8A, or the surfaces of the fluoride phosphor 10 particles may be entirely coated as illustrated in FIG. 8B.

EMBODIMENT EXAMPLE 3

The inventors of the present application added 1 g of PVP-10 and 100 ml of ethanol into a reactor and dissolved the same, and subsequently stirred the prepared alcohol-based solvent (ethanol) and 1 g of the fluoride phosphor according to the present exemplary embodiment represented by Chemical Formula (1) for a long period of time. Thereafter, the inventors mixed 10 ml of TEOS as a silicon oxide precursor with a basic solvent $NH_4OH$ and subsequently slowly applied the aqueous solution to the reactor dropwise. Here, the basic solvent serves to cause a reaction to be aptly undertaken, and various basic materials other than $NH_4OH$ may be used. Thereafter, the inventors stirred the product for approximately 20 minutes to confirm that a precipitate (third precipitate) was formed. Thereafter, the inventors removed a supernatant, washed the third precipitate with ethanol, and performed heat treatment on the third precipitate at a temperature of approximately 130° C. for 1 hour to obtain fluoride phosphor particles with the silicon oxide coated on surfaces thereof and represented by Chemical Formula (1). Meanwhile, in Embodiment Example 3, the inventors washed the third precipitate with ethanol as alcohol, but the present disclosure is not limited thereto and a ketone-based material may also be used.

Figure 8C:
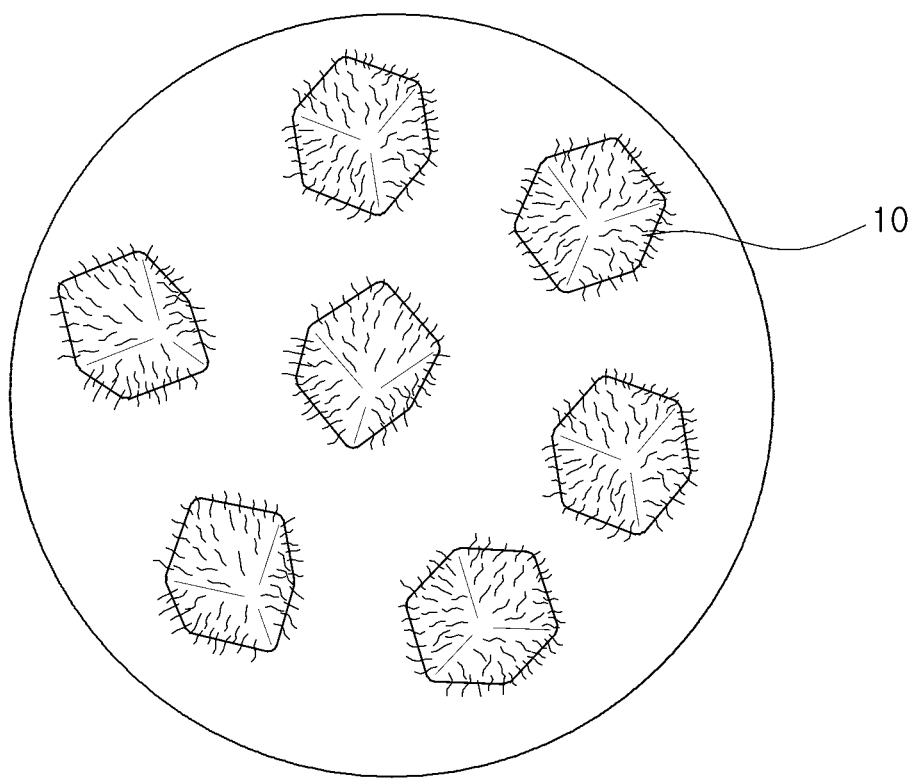
Figure 9:
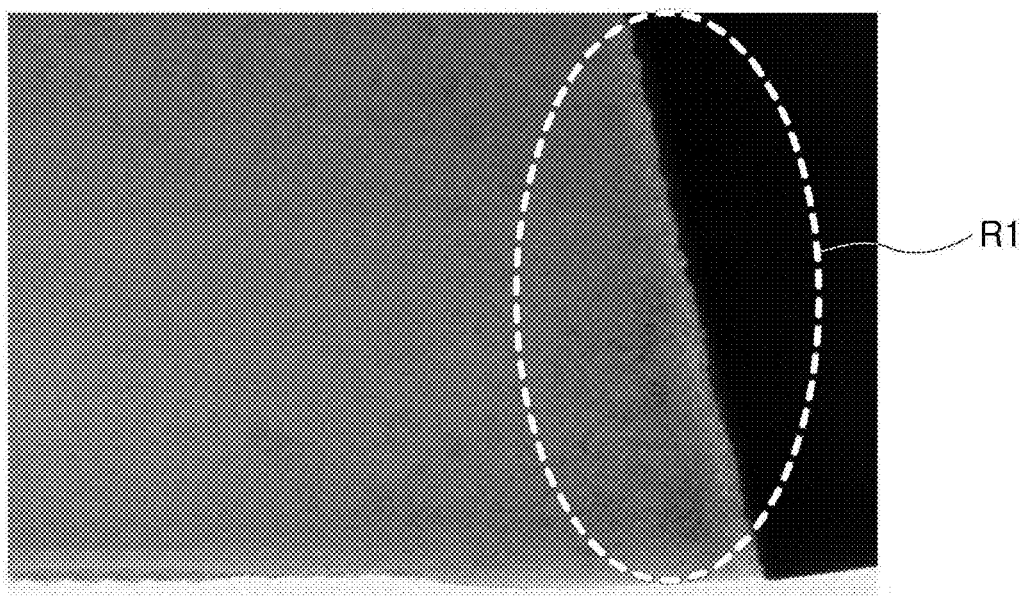
FIG. 9 is a transmission electron microscope (TEM) photograph of a phosphor obtained according to an exemplary embodiment of the present disclosure.

FIG. 9 is a transmission electron microscope (TEM) photograph of a phosphor obtained according to Embodiment Example 3. Referring to FIG. 9, it may be understood that the entire surfaces of the phosphor particles obtained according to Embodiment Example 3 were coated with the silicon oxide as illustrated in FIG. 8C. In this case, the coating thickness was approximately 50 nm, confirming that the phosphor particles were evenly coated (please refer to highlighted region R1 of FIG. 9).

According to the present exemplary embodiment, reliability with respect to moisture of the fluoride phosphor represented by Chemical Formula (1) is improved and the washing operation using the high concentration hydrofluoric acid aqueous solution is performed, impurities on the particle surfaces may be effectively removed, thereby preparing a phosphor having excellent absorption rate and quantum efficiency. In addition, since impurities are removed, the silicon oxide and/or metal oxide may be coated on the surface of the phosphor to have a uniform thickness.

Figure 7:
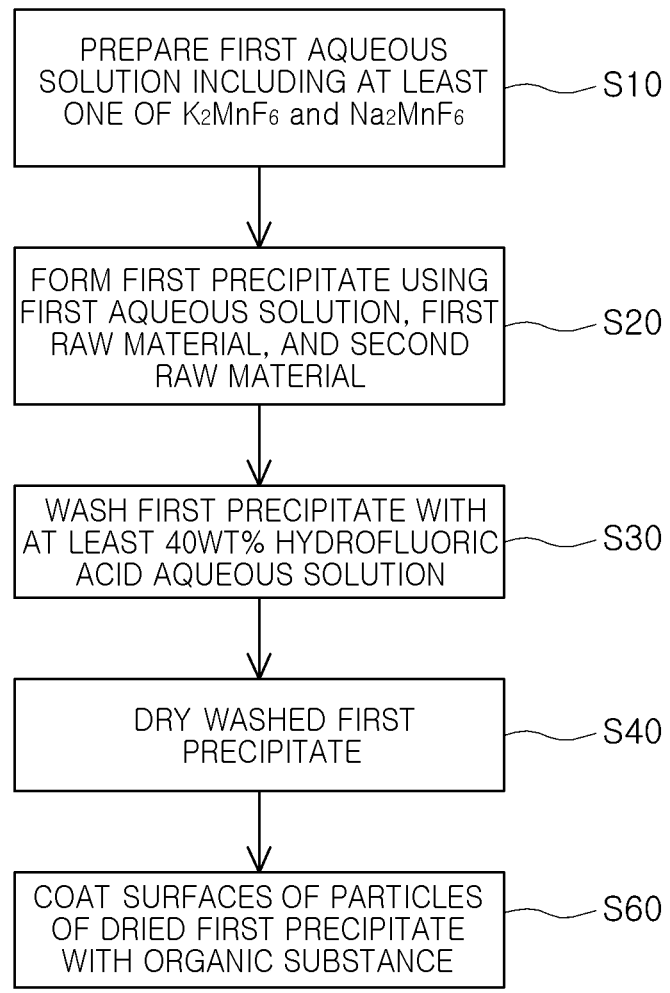

Meanwhile, as the material coated on the surface of the phosphor represented by Chemical Formula (1), an organic substance, besides the silicon oxide and/or metal oxide, may also be used, as illustrated in FIG. 7.

In detail, as illustrated in FIG. 7, the method of preparing a phosphor according to the present exemplary embodiment may further include operation S60 which includes coating the surfaces of phosphor particles, which have been prepared by washing the first precipitate (S30) and drying the washed first precipitate (S40), and represented by Chemical Formula (1), with an organic substance. According to the present exemplary embodiment, as illustrated in FIG. 8C, ligands may be formed on the surfaces of the fluoride phosphor 10 particles to protect the phosphors from moisture.

In the present exemplary embodiment, operation S60 of coating the surfaces of phosphor particles with the organic substance may include mixing the phosphor represented by Chemical Formula (1) with an organic solvent, adding an organic precursor to the mixture product and stirring the same to form a fourth precipitate, and washing the fourth precipitate.

For example, 1-octadecene, toluene, trioctylphosphineoxide, and the like, may be used as the organic solvent, but the present disclosure is not limited thereto. An acetic acid, a stearic acid, a myristic acid, a lauric acid, and the like, may be used as the organic precursor, and the fourth precipitate may be washed using at least one of ketone-based and alcohol-based materials.

EMBODIMENT EXAMPLE 4

The inventors of the present application mixed 2 g of fluoride phosphor prepared as an example according to Embodiment Example 4 and represented by Chemical Formula (1) and 200 ml of ODE (1-Octadecene) in a Teflon vessel, selected at least one of the foregoing organic precursors, added 20 ml of the selected organic precursor, and stirred the mixture for approximately 12 to 20 hours to confirm that a fourth precipitate was formed. Thereafter, the inventors washed the fourth precipitate with acetone three times, and ascertained that the surfaces of the phosphor particles were coated with an organic substance, through FT-IR measurement.

Figure 10:
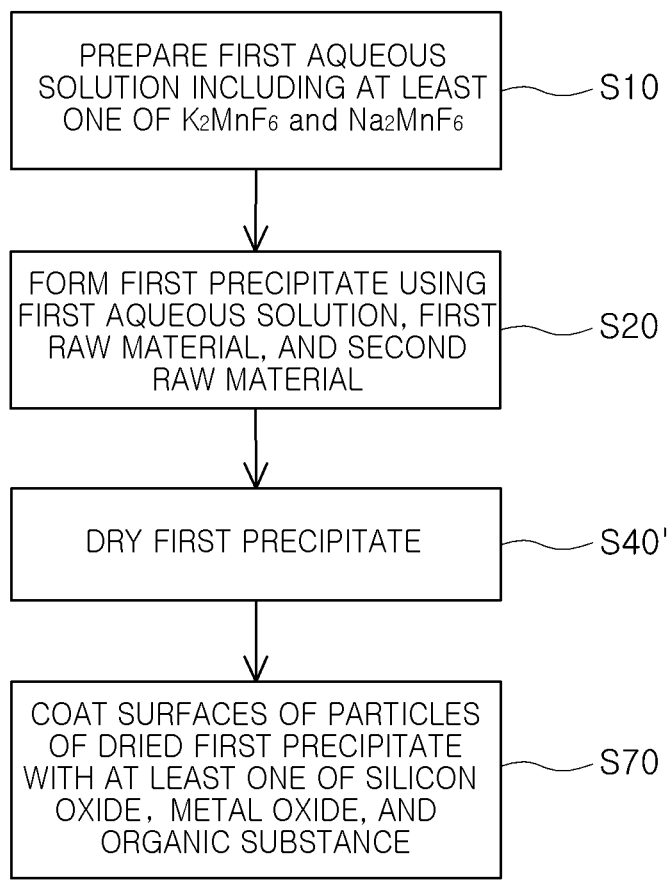
FIG. 10 is a flow chart illustrating a method of preparing a phosphor according to an exemplary embodiment of the present disclosure.

Meanwhile, in the exemplary embodiment described above with reference to FIGS. 6 and 7, the phosphor is washed with a hydrofluoric acid aqueous solution before the surfaces of the fluoride particles represented by Chemical Formula (1) are coated, but the present disclosure is not limited thereto. Namely, according to an exemplary embodiment of the present disclosure, a method of preparing a fluoride phosphor represented by Chemical Formula (1) may include operation S10 of preparing a first aqueous solution including at least one of $K_2MnF_6$ and $Na_2MnF_6$, operation S20 of forming a first precipitate by using the first aqueous solution, a first raw material containing M, and a second raw material containing A, operation S40' of drying the first precipitate, and operation S70 of coating surfaces of particles of the dried first precipitate with at least one of a silicon oxide, a metal oxide, and an organic substance like as illustrated in FIG. 10.

Also, in the present exemplary embodiment, the method may further include an operation of washing the first precipitate with a ketone-based or alcohol-based material, before operation S40' of drying the first precipitate, after operation S20 of forming of the first precipitate.

Table 4 displays experimental data demonstrating effect obtained by coating the surface of the fluoride phosphor represented by Chemical Formula (1) according to the present exemplary embodiment.

Phosphor powders according to Experimental Example 2A, Experimental Example 2B, and Comparative Experimental Example 2 were kept in storage in a high temperature high humidity chamber having a temperature of 85° C. and humidity of 85% and changes in parameters over time were measured. Here, in Experimental Example 2A, a fluoride phosphor represented by Chemical Formula (1) coated with an organic substance was used. In Experimental Example 2B, a fluoride phosphor represented by Chemical Formula (1) coated with a silicon oxide ($SiO_2$) was used. In Comparative Experimental Example 2, a fluoride phosphor represented by Chemical Formula (1), which was not coated, was used.

TABLE 4

| | Lapse of time | Absorption rate | Internal quantum efficiency | External quantum efficiency | Variation of external quantum efficiency |
|---|---|---|---|---|---|
| Experimental Example 2A | 0 hour | 0.675 | 0.860 | 0.592 | |
| | 1 hour | 0.705 | 0.539 | 0.387 | −0.205 |
| | 2 hours | 0.719 | 0.436 | 0.320 | −0.272 |
| | 3 hours | 0.722 | 0.438 | 0.323 | −0.269 |
| Experimental Example 2B | 0 hour | 0.670 | 0.883 | 0.604 | |
| | 1 hour | 0.682 | 0.873 | 0.585 | −0.019 |
| | 2 hours | 0.705 | 0.855 | 0.563 | −0.022 |
| | 3 hours | 0.703 | 0.853 | 0.563 | −0.041 |
| Comparative Experimental Example 2 | 0 hour | 0.707 | 0.849 | 0.613 | |
| | 1 hour | 0.758 | 0.416 | 0.322 | −0.291 |
| | 2 hours | 0.770 | 0.354 | 0.278 | −0.335 |
| | 3 hours | 0.775 | 0.330 | 0.261 | −0.352 |

Referring to Table 4, it can be seen that the uncoated phosphor had its external quantum efficiency significantly reduced (35% after the lapse of 3 hours) in a high temperature high humidity environment. In contrast, in the case of the coated phosphor, a reduction in external quantum efficiency thereof in a high temperature high humidity environment was reduced. Meanwhile, it can be seen that the phosphor coated with a silicon oxide according to the Experimental Example 2B had its external quantum efficiency rarely changed even in a high temperature and high humidity environment (4.1% reduced after the lapse of 3 hours).

Thus, in the case of the preparation method according to the present exemplary embodiment, by coating the surfaces of phosphor particles with at least one of a silicon oxide, a metal oxide, and an organic substance, permeation of ambient moisture may be effectively blocked, obtaining a phosphor having improved reliability.

Hereinafter, a light emitting device employing the fluoride phosphor represented by Chemical Formula (1) will be described.

$A_xMF_y:Mn^{4+}$  Chemical Formula (1)

(wherein 2≤x≤3 and 4≤y≤7, A is at least one element selected from the group consisting of Li, Na, K, Rb, and Cs, and M is at least one element selected from the group consisting Si, Ti, Zr, Hf, Ge, and Sn).

Here, a fluoride phosphor represented by Chemical Formula (1) employed in a light emitting device described hereinafter is not limited to the phosphor prepared by the phosphor preparation method as described above, and any fluoride phosphor may be employed in the light emitting device as described hereinafter as long as it is represented by Chemical Formula (1).

Figure 11A:
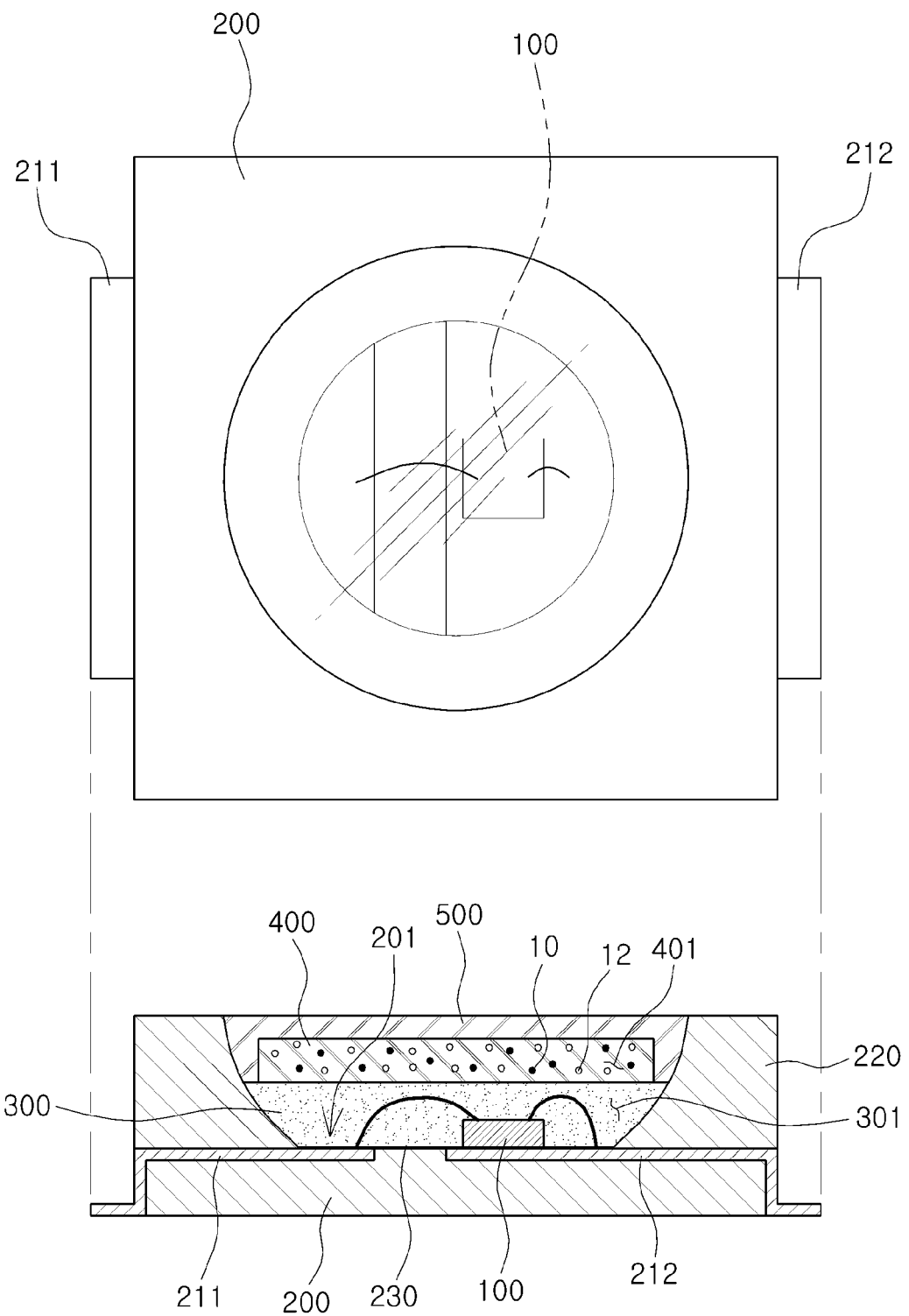
FIGS. 11A through 11C are cross-sectional views and top views illustrating a light emitting device according to an exemplary embodiment of the present disclosure.
Figure 11B:
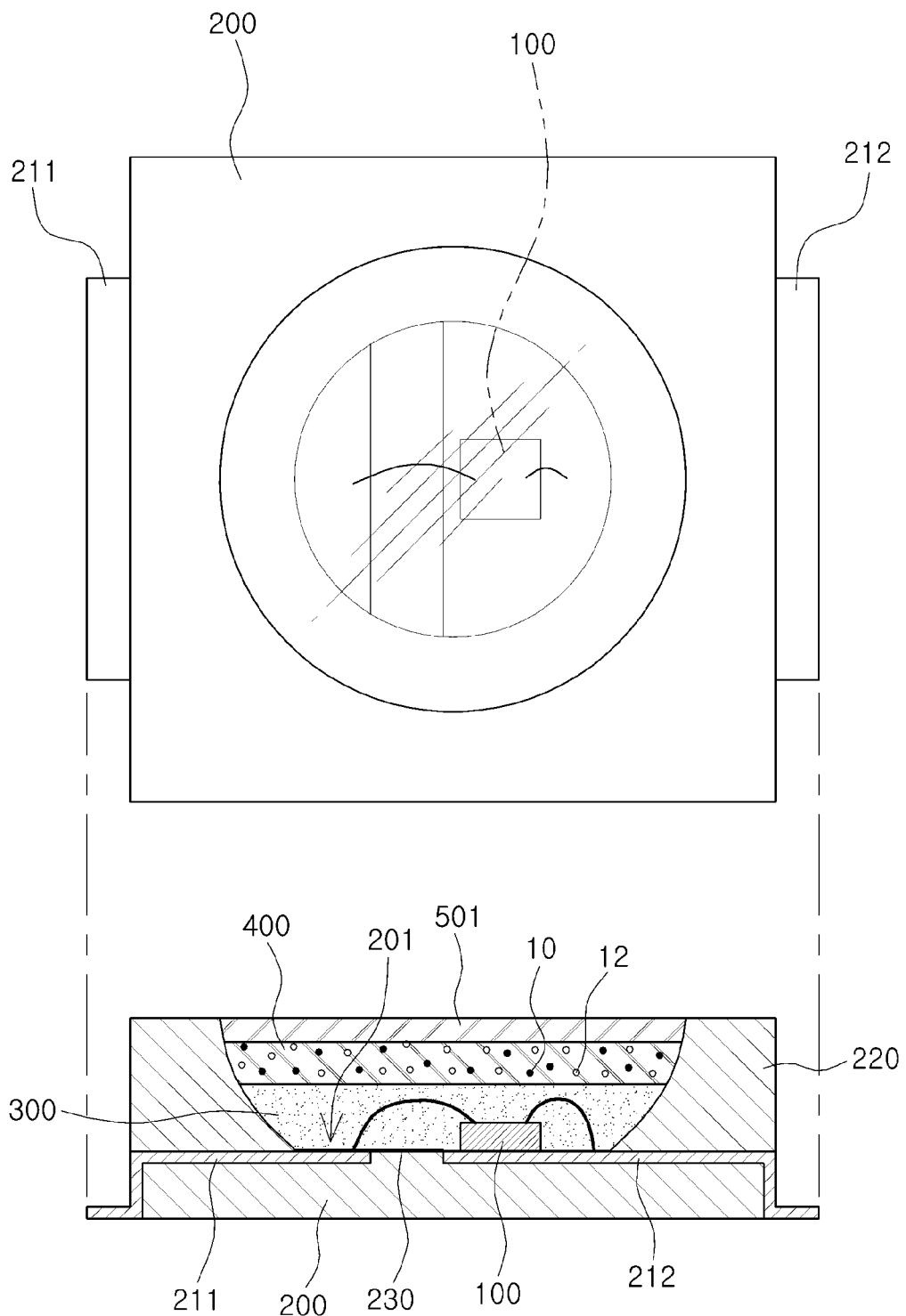
Figure 11C:
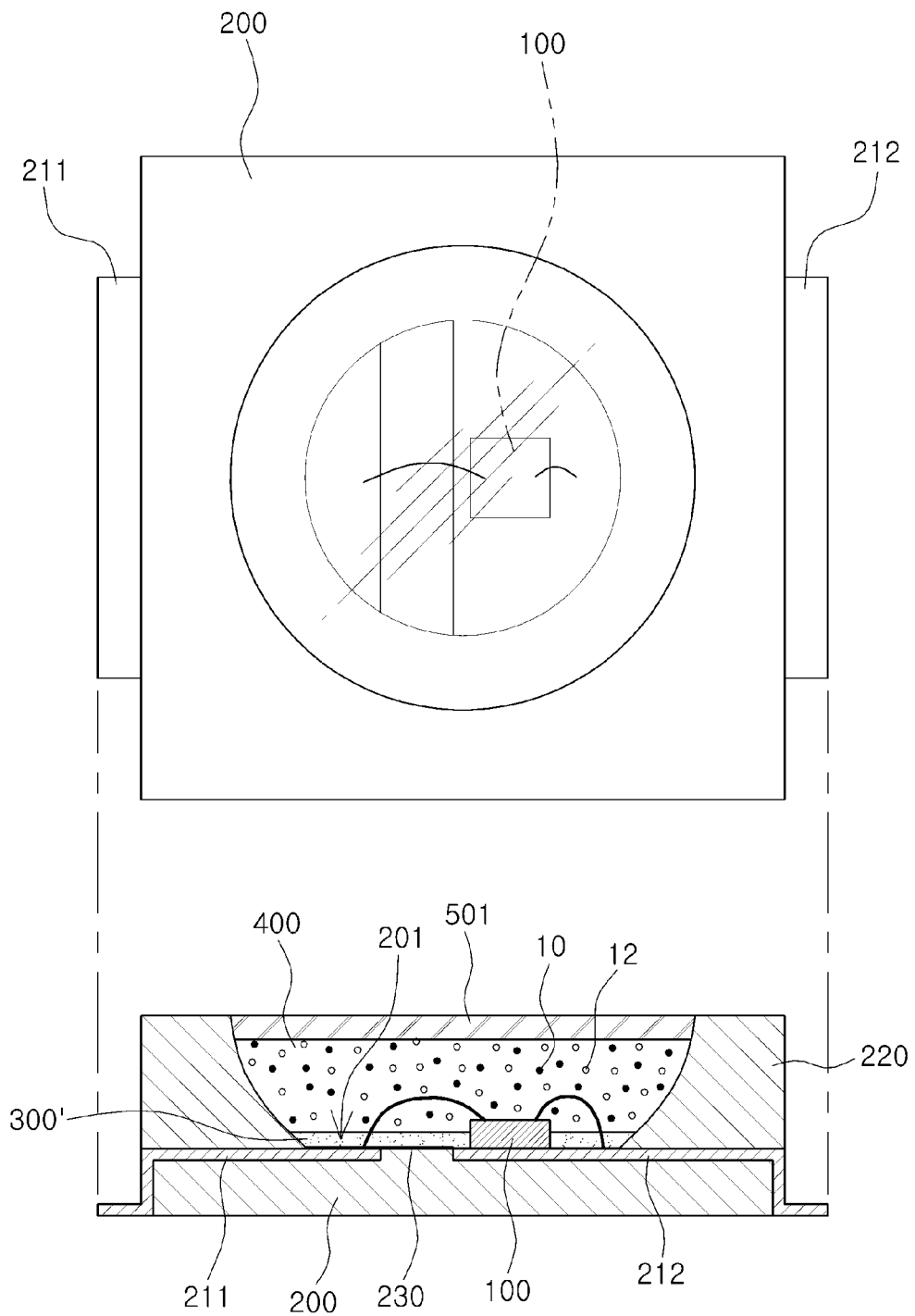

FIGS. 11A through 11C are cross-sectional views and top views illustrating light emitting devices according to an exemplary embodiment of the present disclosure.

Referring to FIG. 11A, a light emitting device according to the present exemplary embodiment includes a substrate 200 having a first surface 201, a light emitting element 100 disposed in the first surface 201 of the substrate 200 and emitting excitation light, and a wavelength converter 400 absorbing the excitation light to emit visible light.

The substrate 200 may be formed of a resin having a high degree of opaqueness and reflectivity, and in this case, the substrate 200 may be formed of a polymer resin that may be easily injection-molded. However, the present disclosure is not limited thereto and the substrate 200 may be formed of various other non-conductive materials. Namely, the substrate 200 may be formed of a non-conductive material such as a ceramic, and in this case, heat dissipation may be facilitated. Also, the substrate 200 may be a printed circuit board with a wiring pattern formed thereon.

The substrate 200 may include a cavity accommodating the light emitting element 100 and a partition 220 surrounding the light emitting element 100, but the present disclosure is not limited thereto. Also, the substrate 200 may include a pair of lead frames 211 and 212 electrically connected to the light emitting element 100 to apply driving power to the light emitting element 100. The pair of lead frames 211 and 212 may be electrically connected to the light emitting element 100 through conductive wires or in a contacting manner, and may be used as terminals for applying an external electrical signal. To this end, the lead frames 211 and 212 may be formed of a metal having excellent electrical conductivity.

The light emitting element 100 may be disposed in the first surface 201 of the substrate 200, and any photoelectric element may be used as the light emitting element 100 as long as it emits light when an electrical signal is applied thereto. Typically, a semiconductor light emitting element 100 having a semiconductor layer epitaxially grown on a growth substrate may be used. For example, the light emitting element 100 may include an n-type semiconductor layer, a p-type semiconductor layer, and an active layer disposed therebetween, but the present disclosure is not limited thereto. Also, the active layer may be formed of a nitride semiconductor including $In_xAl_yGa_{1-x-y}N$ ($0 \le x \le 1$, $0 \le y \le 1$, $x+y \le 1$) having a single quantum well (SQL) structure or a multi-quantum well (MQL) structure. The light emitting element 100 may emit blue light but the present disclosure is not limited thereto.

The wavelength converter 400 may emit blue light, but the present disclosure is not limited thereto.

The wavelength converter 400 may be excited by light emitted from the light emitting unit 100 to emit wavelength-converted visible light. The wavelength converter 400 may include a second resin layer 401 and a fluoride phosphor 10 dispersed in the second resin layer 401. The second resin layer 401 may be formed of a material selected from among epoxy, silicone, strained silicone, a urethane resin, an oxetane resin, acryl, polycarbonate, polyimide, and any combination thereof, but the present disclosure is not limited thereto.

The fluoride phosphor 10 may include a fluoride phosphor 10 material represented by Chemical Formula (1). Here, the fluoride phosphor 10 may be a red phosphor absorbing excitation light to emit red light.

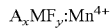  Chemical Formula (1)

(wherein $2 \le x \le 3$ and $4 \le y \le 7$, A is at least one element selected from the group consisting of Li, Na, K, Rb, and Cs, and M is at least one element selected from the group consisting Si, Ti, Zr, Hf, Ge, and Sn).

Also, according to need, the wavelength converter 400 may further include a green phosphor 12 emitting green light, in addition to the fluoride phosphor 10 emitting red light represented by Chemical Formula (1).

Meanwhile, the fluoride phosphor 10 represented by Chemical Formula (1) is vulnerable to moisture, and thus, its application to a product may degrade reliability.

Thus, the light emitting device according to the present exemplary embodiment may include a lower filler 300 and a cover 500, and the wavelength converter 400 may be sealed by at least one of the substrate 200, the lower filler 300, and the cover 500.

The lower filler 300 may fill a space between the wavelength converter 400 and the first surface 201 of the substrate 200 to separate them, and thus, the wavelength converter 400 may be protected from external moisture infiltrating the substrate 200 and introduced to the first surface 201 of the substrate 200. In the present exemplary embodiment, the lower filler 300 may be provided as a first resin layer 301, and the first resin layer 301 may be formed of a material selected from among epoxy, silicone, strained silicone, a urethane resin, an oxetane resin, acryl, polycarbonate, polyimide, and any combination thereof, but the present disclosure is not limited thereto.

In this case, the substrate 200 may further include a moisture-proof coating 230 formed on the first surface 201 on which the light emitting element 100 is disposed. The moisture-proof coating 230 may include at least one of fluoride-based and silica-based coating agents, thus effectively preventing moisture infiltration.

Meanwhile, a resin material constituting the first resin layer 301 provided in the lower filler 300 and that constituting the second resin layer 401 provided in the wavelength converter 400 may have different refractive indices. For example, the resin material of the first resin layer 301 may be greater than that of the second resin layer 401.

In this case, when light generated by the light emitting element 100 passes through the first and second resin layers 301 and 401 and is emitted outwardly, a difference in a refractive index with respect to an ambient material (air) is gradually decreased, reducing total internal reflection due to the difference in the refractive index, and thus, light extraction efficiency may also be improved.

The difference between the refractive indices of the first and second resin layers 301 and 401 may be obtained by employing resin materials having different refractive indices. Alternatively, in a case in which the same material, for example, the same silicone resin, is used to form the first and second resin layers 301 and 401, for example, amounts of silica contained in the resin may be appropriately varied to obtain a difference in refractive indices.

The cover 500 may be formed on the wavelength converter 400 to cover the upper surface of the wavelength converter 400. Thus, infiltration of external moisture into the upper surface of the wavelength converter 400 may be effectively blocked. The cover 500 may be formed of a material including glass, but the present disclosure is not limited thereto.

In FIG. 11A, it is illustrated that the cover 500 is formed to cover both the upper surface and the lateral surfaces of the wavelength converter 400, but the present disclosure is not limited thereto and, as illustrated in FIG. 11B, a cover 501 may be formed to cover only the upper surface of the wavelength converter 400.

Also, in FIGS. 11A and 11B, it is illustrated that the lower filler 300 covers the upper surface of the light emitting element 100, but the present disclosure is not limited thereto and, as illustrated in FIG. 11C, a lower filler 300' may be disposed to allow the upper surface of the light emitting element 100 to be open. In this case, the lower filler 300' may be formed of a transparent material as in the exemplary embodiments of FIGS. 11A and 11B, but the present disclosure is not limited thereto and the lower filler 300' may include a reflective material to readily reflect light emitted from the light emitting element 100.

Figure 12A:
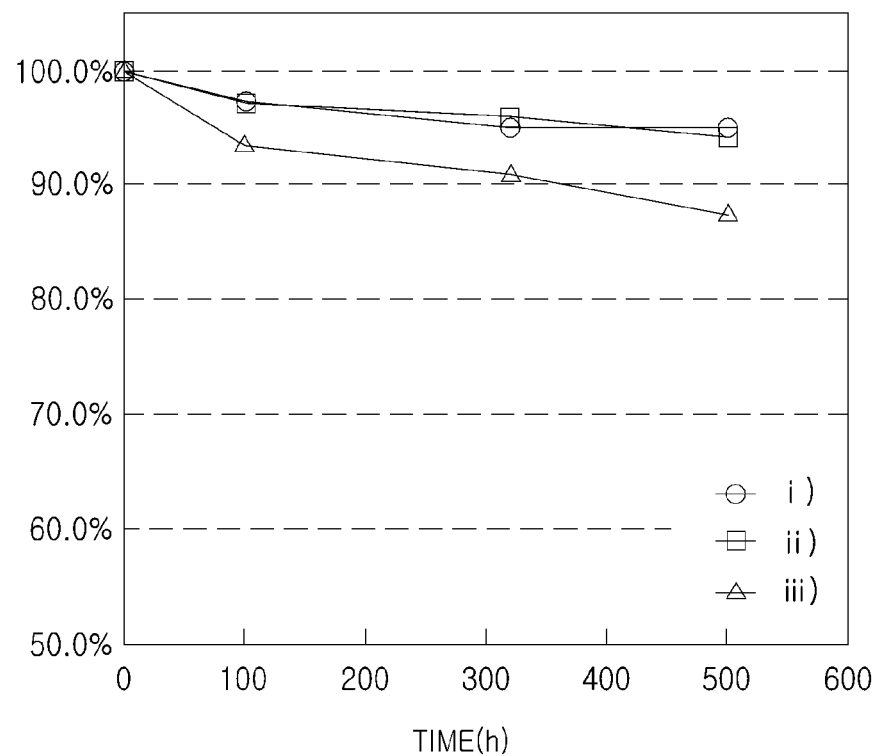
FIGS. 12A through 12C are graphs illustrating effects obtained by the light emitting device according to an exemplary embodiment of the present disclosure.
Figure 12B:
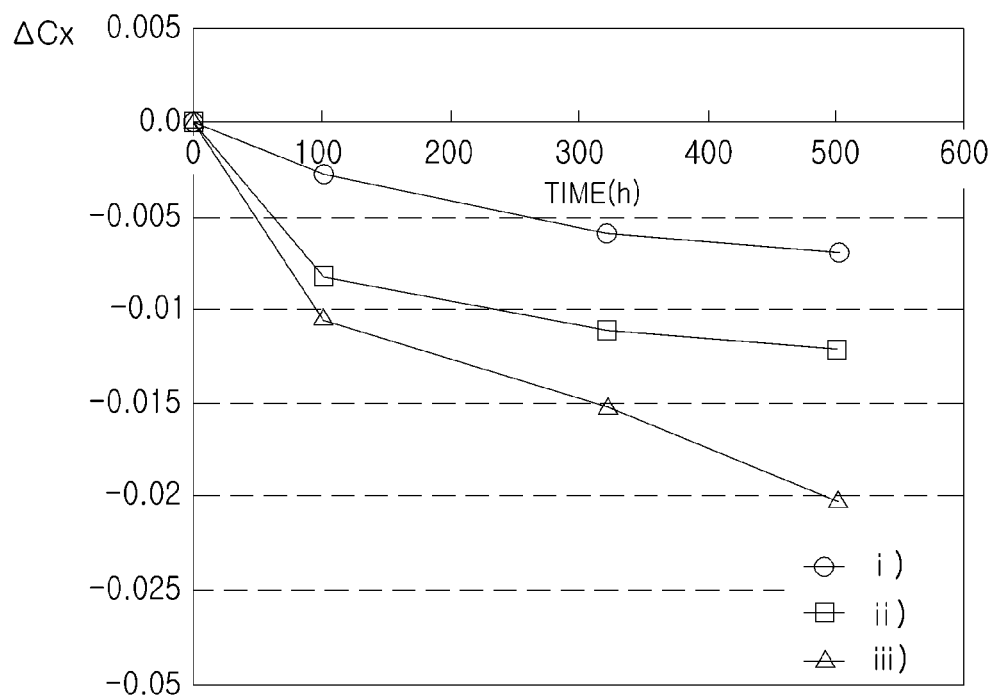
Figure 12C:
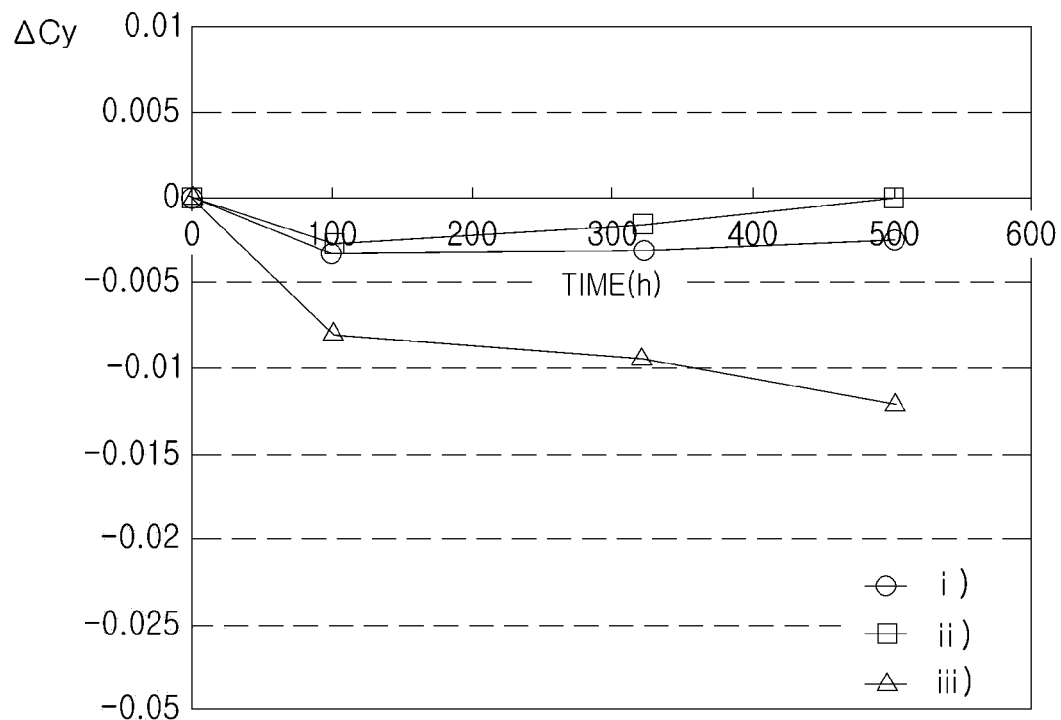

FIGS. 12A through 12C are graphs illustrating effects obtained by the light emitting device according to an exemplary embodiment of the present disclosure.

Here, Embodiment Example 5A(i) used the light emitting device according to FIG. 11A, Embodiment Example 5B(ii) used the light emitting device according to FIG. 11B, and Comparative Example 5A(iii) used the light emitting device implemented to be identical to those of Embodiment Examples 5A and 5B, except that the lower filler and the cover were not provided, to observe changes in parameters in a high temperature high humidity chamber having a temperature of 85° C. and humidity of 85%. Here, longitudinal axis values in FIGS. 12A, 12B, and 12C indicate variations (%) of luminous intensity [cd], and [ΔCx] and [ΔCy], degrees of shifting of color coordinates, respectively, and horizontal axis values indicate time (unit:hour).

Referring to FIG. 12A illustrating measurement of changes in luminous intensity and FIGS. 12B and 12C illustrating measurement of changes in color characteristics (Cx and Cy of CIE color coordinates), it can be seen that Embodiment Examples 5A and 5B employing the lower filler and the cover had luminous intensity and color characteristics changed less than those of Comparative Example 5A and reliability better than those of Comparative Example 5A.

Figure 13:
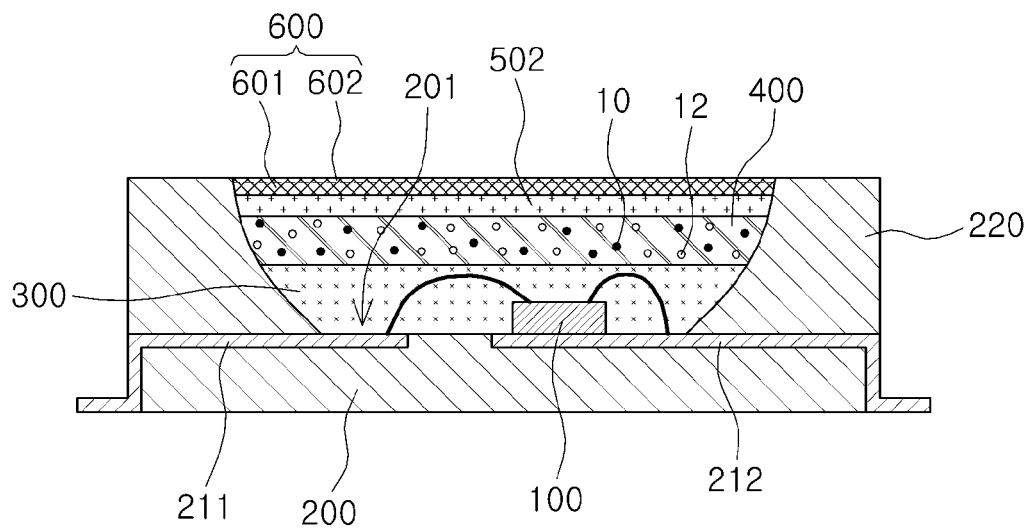
FIG. 13 is a cross-sectional view illustrating a light emitting device according to a modified embodiment of the present disclosure.

FIG. 13 is a cross-sectional view illustrating a light emitting device according to a modified embodiment of the present disclosure.

Referring to FIG. 13, a light emitting device according to the present exemplary embodiment includes a substrate 200 having a first surface 201, a light emitting element 100 disposed in the first surface 201 of the substrate 200 and emitting excitation light, and a wavelength converter 400 absorbing the excitation light to emit visible light. The wavelength converter 400 includes the fluoride phosphor 10 represented by the aforementioned Chemical Formula (1).

Also, the light emitting device may include a lower filler 300 filling a space between the wavelength converter 400 and the first surface 201 to separate them and a first cover 502 formed on the wavelength converter 400. The wavelength converter 400 may be sealed by at least one of the substrate 200, the lower filler 300, and the first cover 502.

In the present exemplary embodiment, the lower filler 300 and the first cover 502 may be formed of an inorganic substance. The inorganic substance used to form the lower filler 300 and that used to form the first cover 502 may be identical, but the present disclosure is not limited thereto and the lower filler 300 and the first cover 502 may be formed of different inorganic substances. Here, the inorganic substance constituting the first cover 502 may be at least a transparent material.

In addition, the light emitting device of the present exemplary embodiment may include a second cover 600 formed on the first cover 502. In this case, moisture infiltrating the first cover 502 and introduced to the wavelength converter 500 may be more effectively blocked.

The second cover 600 may include a resin, and the resin constituting the second cover 600 may be, for example, a silicone resin.

In the present exemplary embodiment, the second cover 600 may include a first layer 601 and a second layer 602 formed on the first layer 601. The first and second layers 602 may have different refractive indices. For example, the first layer 601 may be formed of a methyl-based silicone resin (refractive index: approximately 1.46), and the second layer 602 may be formed of a phenyl-based silicone resin (refractive index: approximately 1.53). In the aspect of moisture prevention, implementation of the second cover 600 with only a phenyl-based silicone resin (moisture permeation rate: 12 g/m$^2$/day) having low moisture permeation may be effective more than implementation of the second cover 600 with the methyl-based silicone resin (moisture permeation rate: 19 g/m$^2$/day). However, in case of laminating silicone resins having different refractive indices, light scattering may be induced due to difference in refractive indices, obtaining an advantageous effect in terms of light extraction efficiency.

Figure 14:
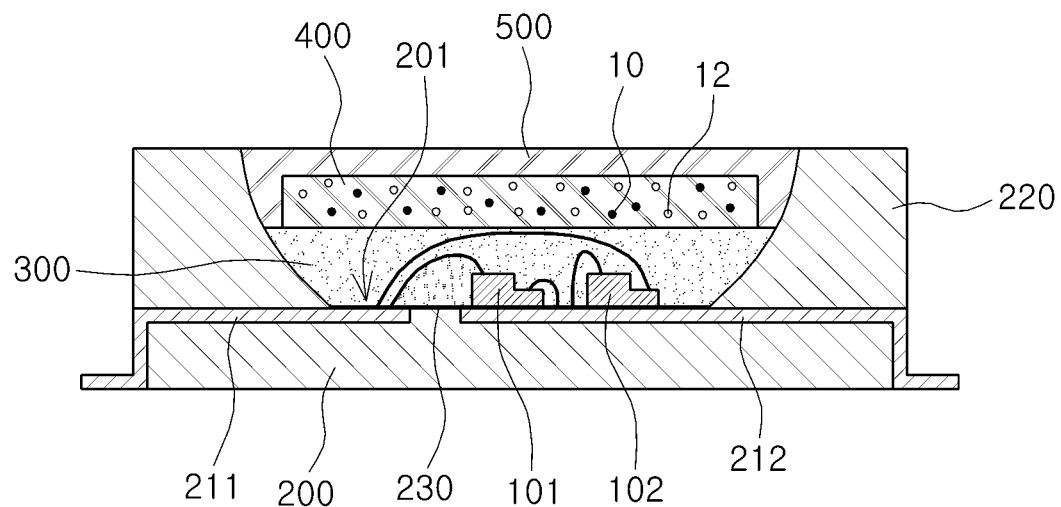
FIG. 14 is a cross-sectional view illustrating a light emitting device according to a modified embodiment of the present disclosure.

FIG. 14 is a cross-sectional view illustrating a light emitting device according to a modified embodiment of the present disclosure.

Referring to FIG. 14, a light emitting device according to the present exemplary embodiment includes a substrate 200 having a first surface 201, light emitting elements 101 and 102 disposed in the first surface 201 of the substrate 200 and emitting excitation light, and a wavelength converter 400 absorbing the excitation light to emit visible light. The wavelength converter 400 includes the fluoride phosphor 10 represented by the aforementioned Chemical Formula (1).

The light emitting device may include a lower filler 300 filling a space between the wavelength converter 400 and the first surface 201 to separate them and a cover 500 formed on the wavelength converter 400. The wavelength converter 400 may be sealed by at least one of the substrate 200, the lower filler 300, and the cover 500.

In the present exemplary embodiment, the light emitting elements 101 and 102 may be provided in plural. In this case, the plurality of light emitting elements 101 and 102 may be connected in a reverse-polarity manner. In detail, the light emitting elements 101 and 102 according to the present exemplary embodiment include a first light emitting element 101 and a second light emitting element 102. A first electrode of the first light emitting element 101 is electrically connected to a second electrode of the second light emitting element 102, and a second electrode of the first light emitting element 101 is connected to a first electrode of the second light emitting element 102, whereby the first and second light emitting elements 101 and 102 are connected in a reverse-polarity manner.

In this case, the first and second light emitting elements 101 and 102 may emit light alternately upon receiving external alternating current (AC) power. According to the present exemplary embodiment, a light emitting device driven upon directly receiving AC power without having to rectify the power into DC power may be obtained. In addition, a flickering phenomenon may be improved by decay time characteristics of the fluoride phosphor 10 represented by Chemical Formula (1). This will be described with reference to FIGS. 15 and 16.

Figure 15:
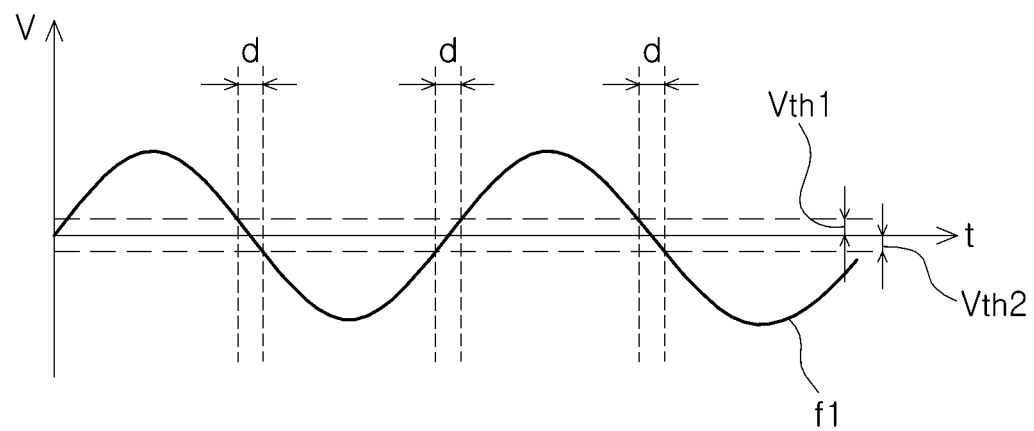
FIG. 15 is a graph illustrating a factor causing a flickering phenomenon occurring when alternating current (AC) power is applied to a light emitting device.
Figure 16:
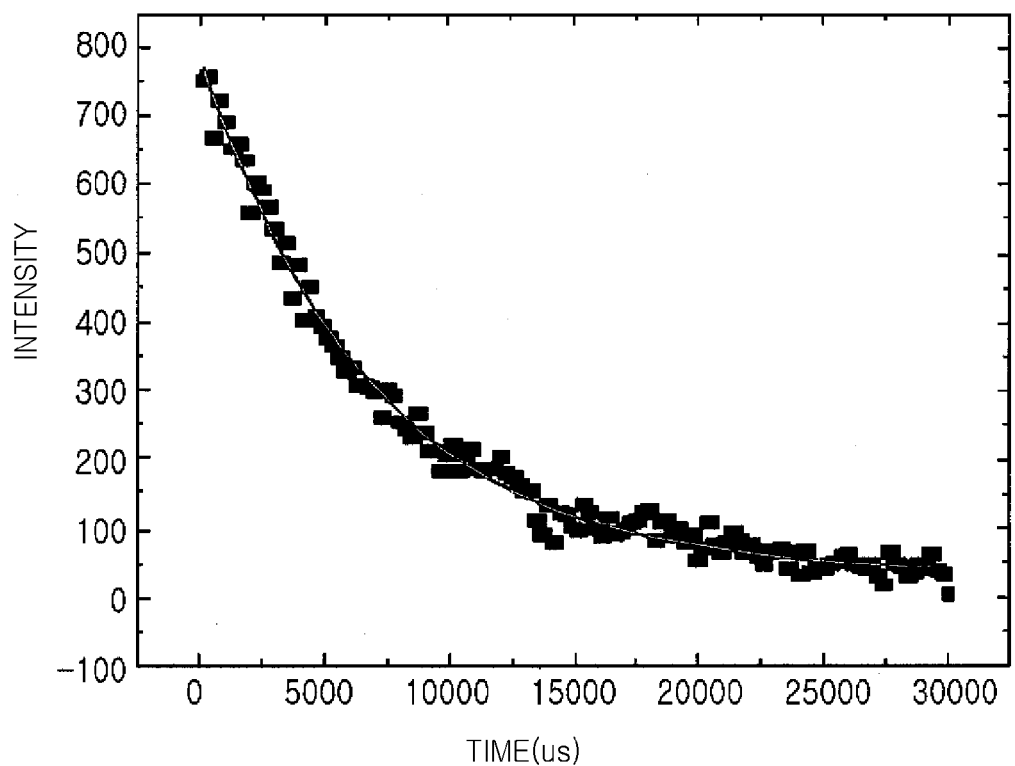
FIG. 16 is a graph illustrating a decay time of a fluoride phosphor represented by Chemical Formula (1)

FIG. 15 is a graph illustrating a factor causing a flickering phenomenon occurring when alternating current (AC) power is applied to a light emitting device, and FIG. 16 is a graph illustrating a decay time of a fluoride phosphor represented by Chemical Formula (1).

Referring to FIG. 15, when the first and second light emitting elements 101 and 102 connected in a reverse-polarity manner are directly driven with AC power, the applied AC power may have a waveform indicated by fl of FIG. 15, and in this case, due to the characteristics of threshold voltages Vth1 and Vth2 of the first and second light emitting elements 101 and 102, there may be durations d in which both the first and second light emitting elements 101 and 102 do not emit light. This may be recognized as a flickering phenomenon when viewed externally, degrading light quality.

However, as illustrated in FIG. 16, it can be seen that the fluoride phosphor represented by Chemical Formula (1) has a long decay time. In detail, in a case in which a phosphor is excited to emit a wavelength-converted light, when a time taken for the emitted light to reach a half value of a maximum intensity thereof is a decay time, a KSF-based phosphor has a decay time corresponding to approximately 7 ms as illustrated in FIG. 16, a numerical value greater by a hundred thousand than that of a different phosphor having a decay time ranging from a few ns to a few ns, for example, a YAG-based phosphor having a decay time of 60 ns.

Thus, according to the present exemplary embodiment, even in the duration d in which both the first and second light emitting elements 101 and 102 do not emit light, the fluoride-based phosphor represented by Chemical Formula (1) according to the present exemplary embodiment is maintained to emit light during a predetermined period of time, significantly reducing a flickering phenomenon.

Figure 17:
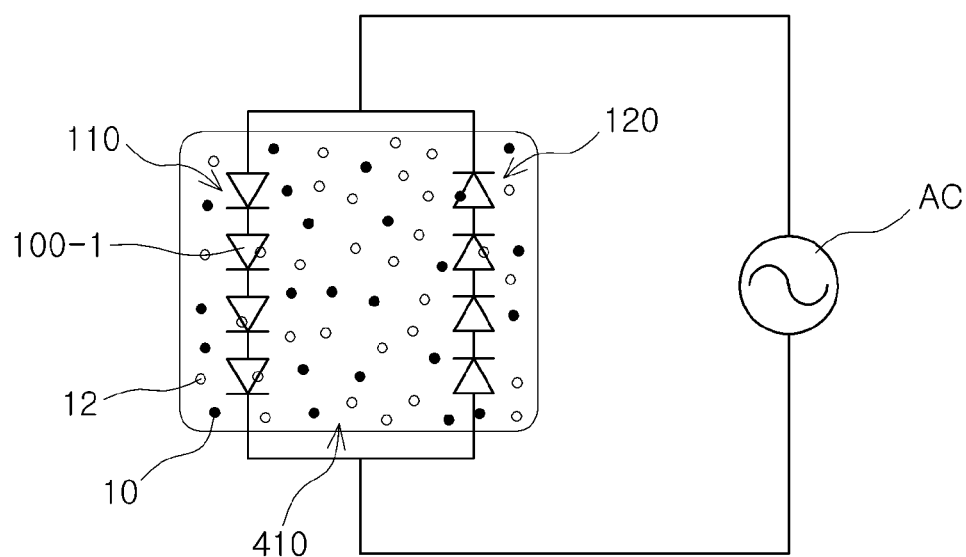
FIGS. 17 and 18 are conceptual views schematically illustrating a light emitting device according to another exemplary embodiment of the present disclosure.
Figure 18:
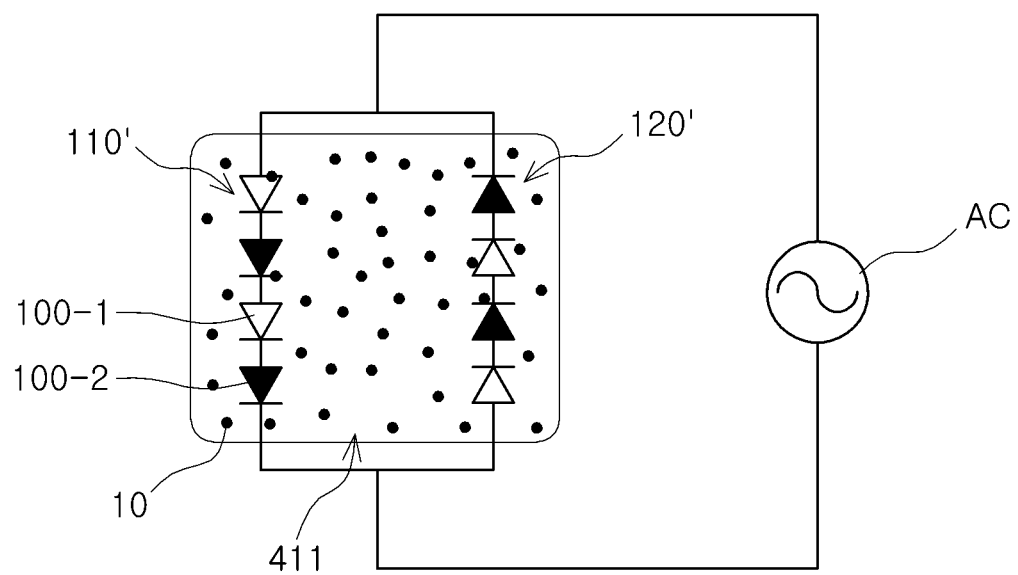

FIGS. 17 and 18 are conceptual views schematically illustrating a light emitting device according to another exemplary embodiment of the present disclosure.

Referring to FIG. 17, the light emitting device according to the present exemplary embodiment includes a first light emitting element array 110 and a second light emitting element array 120 emitting excitation light Here, a light emitting element may be understood as having a concept including a light emitting element package including a semiconductor light emitting element, rather than indicating only a semiconductor light emitting element itself.

In the present exemplary embodiment, the first light emitting element array 110 and the second light emitting element 120 may be connected in a reverse-polarity manner and may alternately emit light upon receiving external AC power.

The light emitting device may include a wavelength converter 410 absorbing excitation light emitted from the first and second light emitting element arrays 110 and 120 to emit visible light having a converted wavelength. The wavelength converter 410 may include a fluoride phosphor represented by Chemical Formula (1).

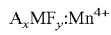:Mn$^{4+}$            Chemical Formula (1)

(wherein 2≤x≤3 and 4≤y≤7, A is at least one element selected from the group consisting of Li, Na, K, Rb, and Cs, and M is at least one element selected from the group consisting Si, Ti, Zr, Hf, Ge, and Sn).

According to the present exemplary embodiment, a light emitting device in which first and second light emitting element arrays 110 and 120 are driven with AC power and the fluoride phosphor is maintained to emit light for a predetermined period of time even in durations in which the first and second light emitting element arrays 110 and 120 do not emit light to thus considerably reduce a flickering phenomenon may be obtained.

In addition, in the exemplary embodiment of FIG. 17, it is illustrated that the first and second light emitting element arrays 110 and 120 include blue light emitting elements 100-1 each emitting blue light and the wavelength converter 410 includes a red phosphor, a fluoride phosphor 10, and a green phosphor 12, but the present disclosure is not limited thereto.

As illustrated in FIG. 18, each of first and second light emitting element arrays 100' and 120' may include blue light emitting elements 100-1 emitting blue light and green light emitting elements 100-2 emitting green light, and a wavelength converter 411 may include the fluoride phosphor 10 represented by Chemical Formula (1) without a green phosphor.

Hereinafter, a method of effectively manufacturing the light emitting devices according to the aforementioned exemplary embodiments will be described.

Figure 19:
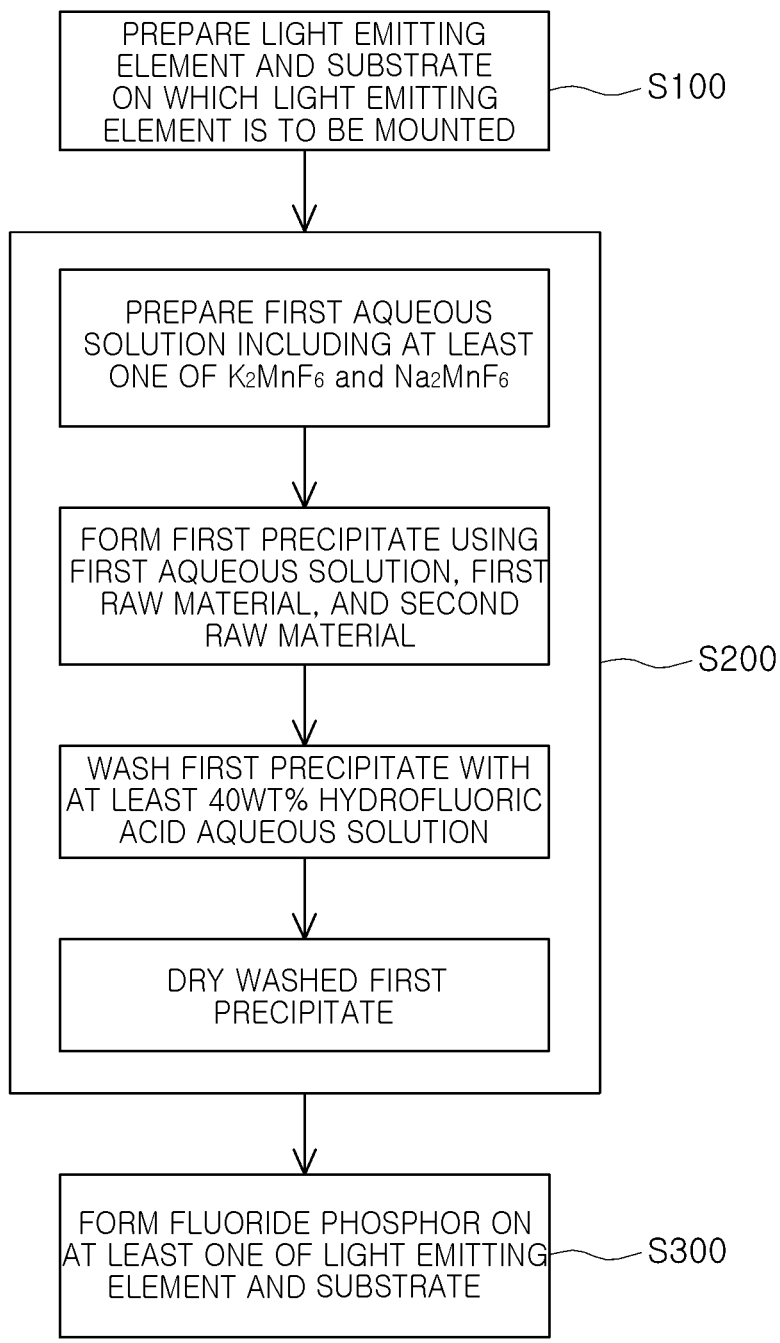
FIG. 19 is a flow chart illustrating a method of manufacturing a light emitting device according to an exemplary embodiment of the present disclosure.
Figure 20:
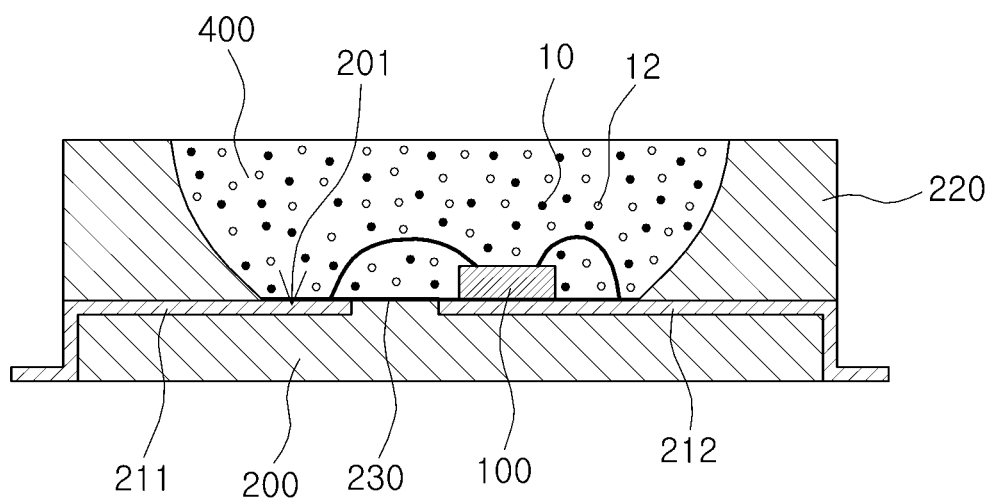
FIG. 20 is a cross-sectional view schematically illustrating a light emitting device manufactured according to the exemplary embodiment of FIG. 19.

FIG. 19 is a flow chart illustrating a method of manufacturing a light emitting device according to an exemplary embodiment of the present disclosure, and FIG. 20 is a cross-sectional view schematically illustrating a light emitting device manufactured according to the exemplary embodiment of FIG. 19.

Referring to FIGS. 19 and 20, a method of manufacturing a light emitting device according to the present exemplary embodiment includes operation S100 of preparing a light emitting element 100 emitting excitation light and a substrate 200 on which the light emitting element 100 is mounted, and operation S200 of preparing a fluoride phosphor 10 represented by Chemical Formula (1).

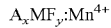:Mn$^{4+}$            Chemical Formula (1)

(wherein 2≤x≤3 and 4≤y≤7, A is at least one element selected from the group consisting of Li, Na, K, Rb, and Cs, and M is at least one element selected from the group consisting Si, Ti, Zr, Hf, Ge, and Sn).

The fluoride phosphor 10 represented by Chemical Formula (1) may absorb excitation light emitted from the light emitting device 100 to emit visible light.

First, operation S100 of preparing the light emitting element 100 emitting excitation light and the substrate 200 on which the light emitting element 100 is mounted will be described in detail. The substrate 200 may be formed of a resin having a high degree of opaqueness and reflectivity, and in this case, the substrate 200 may be formed of a polymer resin that may be easily injection-molded. However, the present disclosure is not limited thereto and the substrate 200 may be formed of various other non-conductive materials. Namely, the substrate 200 may be formed of a non-conductive material such as a ceramic, and in this case, heat dissipation may be facilitated. Also, the substrate 200 may be a printed circuit substrate with a wiring pattern formed thereon. In the present exemplary embodiment, the substrate 200 may include a cavity accommodating the light emitting element 100 and a partition 200 surrounding the light emitting element 100.

The substrate 200 may have a first surface 201 provided as a surface on which the light emitting element 100 is mounted, and may include a pair of lead frames 211 and 212 electrically connected to the light emitting element 100 to apply driving power to the light emitting element 100.

The light emitting element 100 may be mounted on the first surface 201 of the substrate 200, and any photoelectric element may be used as the light emitting element 100 as long as it emits light when an electrical signal is applied thereto. Typically, a semiconductor light emitting element 100 having a semiconductor layer epitaxially grown on a growth substrate may be used. For example, the light emitting element 100 may include an n-type semiconductor layer, a p-type semiconductor layer, and an active layer disposed therebetween, but the present disclosure is not limited thereto. Also, the active layer may be formed of a nitride semiconductor including In$_x$Al$_y$Ga$_{1-x-y}$N (0≤x≤1, 0≤y≤1, x+y≤1) having a single quantum well (SQL) structure or a multi-quantum well (MQL) structure. The light emitting element 100 may emit blue light but the present disclosure is not limited thereto.

Next, operation S200 of preparing a fluoride phosphor 10 represented by the aforementioned Chemical Formula (1) will be described in detail.

Operation S200 may include operation of preparing a first aqueous solution including at least one of K$_2$MnF$_6$ and Na$_2$MnF$_6$, operation of forming a first precipitate using the first aqueous solution, a first raw material containing M, and a second raw material containing A, operation of washing the first precipitate with at least a 40 wt % hydrofluoric acid aqueous solution, and operation of drying the washed first precipitate.

Namely, operation S200 of preparing the fluoride phosphor 10 may be understood as an operation of performing the method of preparing the fluoride phosphor 10 described in the exemplary embodiment of FIG. 1, for example.

As in the exemplary embodiment of FIG. 1 as described above, in operation S200, operation of preparing the first aqueous solution may include dissolving KH$_{F2}$ power or NaH$_{F2}$ power and KMn$_{O4}$ powder or NaMn$_{O4}$ powder in a hydrofluoric acid aqueous solution, adding hydrogen peroxide to the product to form a second precipitate; and stirring the second precipitate in a hydrofluoric acid aqueous solution to remove KH$_{F2}$ powder or NaH$_{F2}$ powder remaining in the second precipitate.

The first aqueous solution may be a first hydrofluoric acid aqueous solution having at least one of KMnF$_6$ and NaMnF$_6$ dissolved therein, and in this case, an operation of forming a first precipitate may include an operation of stirring the first raw material in the first hydrofluoric acid aqueous solution and operation of adding the second raw material to the product to form the first precipitate.

Through the foregoing process, impurities of the surface of the fluoride phosphor 10 are effectively removed, and the obtained fluoride phosphor 10 may have an absorption rate equal to or greater than 0.75, internal quantum efficiency equal to or greater than 0.75, and external quantum efficiency equal to or greater than 0.65, with respect to excitation light having a wavelength of 450 nm, but the present disclosure is not limited thereto.

Also, as in the exemplary embodiment as described above with reference to FIG. 6, the method may further include operation of coating surfaces of phosphor particles represented by Chemical Formula (1) with at least one of a silicon oxide and a metal oxide, after the drying of the washed first precipitate.

In this case, for example, an operation of coating surfaces of the phosphor particles with at least one of the silicon oxide and the metal oxide may include an operation of preparing an alcohol-based solvent with a polymer dissolved therein, operation of stirring the prepared alcohol-based solvent and the phosphor represented by Chemical Formula (1), an operation of adding a basic aqueous solution including at least one of a silicon oxide precursor and a metal oxide precursor to the stirred product and stirring the same to form a third precipitate, and an operation of heating the third precipitate.

In addition, as in the exemplary embodiment as described above with reference to FIG. 7, the method may further include operation of coating surfaces of phosphor particles represented by Chemical Formula (1) with an organic substance.

In this case, operation of coating the surfaces of phosphor particles with an organic substance may include an operation of mixing the phosphor represented by Chemical Formula (1) with an organic solvent, an operation of adding an organic precursor to the mixture product and stirring the same to form a fourth precipitate, and an operation of washing the fourth precipitate.

Meanwhile, in the flow chart in FIG. 19, operation S200 of preparing the fluoride phosphor 10 is performed after operation S100 of preparing the light emitting element 100 and the substrate 200, but the present disclosure is not limited to the order.

Namely, operation S200 of preparing the fluoride phosphor 10 may be first performed, and operation S100 of preparing the light emitting element 100 and the substrate 200 may be subsequently performed, or operation S100 of preparing the light emitting element 100 and the substrate 200 and operation S200 of preparing the fluoride phosphor 10 may be simultaneously performed according to the method of manufacturing a light emitting device intended by the present disclosure.

Thereafter, after operation S100 of preparing the light emitting element 100 emitting excitation light and the substrate 200 on which the light emitting element 100 is mounted and operation S200 of preparing the fluoride phosphor 10 represented by Chemical Formula (1) are completed, the fluoride phosphor 10 is formed on at least one of the light emitting element 100 and the substrate 200 (S300).

Here, the fluoride phosphor 10 may be contained in the wavelength converter 400. In this case, the wavelength converter 400 may include a material selected from among epoxy, silicone, strained silicone, a urethane resin, an oxetane resin, acryl, polycarbonate, polyimide, and any combination thereof, and the wavelength converter 400 may further include a green phosphor 12 emitting green light as a wavelength conversion means, in addition to the fluoride phosphor.

A light emitting device as illustrated in FIG. 20 may be obtained through the foregoing operations S100, S200, and S300.

Meanwhile, in the present exemplary embodiment operation S300 may include: operation of forming a lower filler on the first surface of the substrate on which the light emitting is mounted, operation of forming a wavelength converter including the prepared fluoride phosphor on the lower filler such that the wavelength converter is separated from the first surface of the first substrate, and operation of forming a cover on the wavelength converter. Here, the wavelength converter may be sealed by at least one of the substrate, the lower filler, and the cover.

The lower filler and the cover may be formed of an inorganic substance, but the present disclosure is not limited thereto.

Namely, in this manner, the light emitting device illustrated in FIGS. 11A through 11C as described above may be obtained. In this respect, contents described above with reference to FIGS. 11A through 11C may be applied in the same manner.

In other words, as described above with reference to FIGS. 11A through 11C, the lower filler 300 may be a first resin layer 301 including a resin, and the wavelength converter 400 may include phosphors 10 and 12 and a second resin layer 401 having the phosphors 10 and 120 dispersed therein. Here, resin materials constituting the first and second resin layers 301 and 401 may have different refractive indices. The resin material constituting the first resin layer 301 may have a refractive index greater than that of the resin material constituting the second resin layer 401, but the present disclosure is not limited thereto.

Also, operation S300 may further include an operation of forming a moisture-proof coating 230 on the first surface 201 of the substrate 200, before forming the lower filler 30. The moisture-proof coating 230 may include at least one of fluoride-based and silica-based coating agents.

The cover 500 may be formed of a material including glass. Here, as illustrated in FIG. 11A, the cover 500 may be formed on the upper surface and the lateral surfaces of the wavelength converter 400. To this end, operation of forming the cover 500 may include operation of forming the cover 500 on the upper surface and the lateral surfaces of the wavelength converter 400 to cover the upper surface and the lateral surfaces of the wavelength converter 400.

Also, as in the light emitting device illustrated in FIG. 13, the cover 500 may include a first cover 502 and a second cover 600. In this case, an operation of forming the cover 500 may include operation of forming the first cover 502 disposed on the wavelength converter 400 and operation of forming the second cover 600 including a resin on the first cover 502.

The second cover 600 may include a first layer 601 and a second layer 602 having different refractive indices, but the present disclosure is not limited thereto. For example, the first layer 601 may include methyl-based silicone and the second layer 602 may include phenyl-based silicone.

Meanwhile, the light emitting device manufactured according to the present exemplary embodiment may be, for example, a light emitting device emitting light alternately upon receiving AC power as illustrated in FIG. 14.

In this case, the light emitting device may include first and second light emitting elements 101 and 102. The first and second light emitting elements 101 and 102 may be connected in a reverse-polarity manner and alternately emit light through external AC power.

Figure 21:
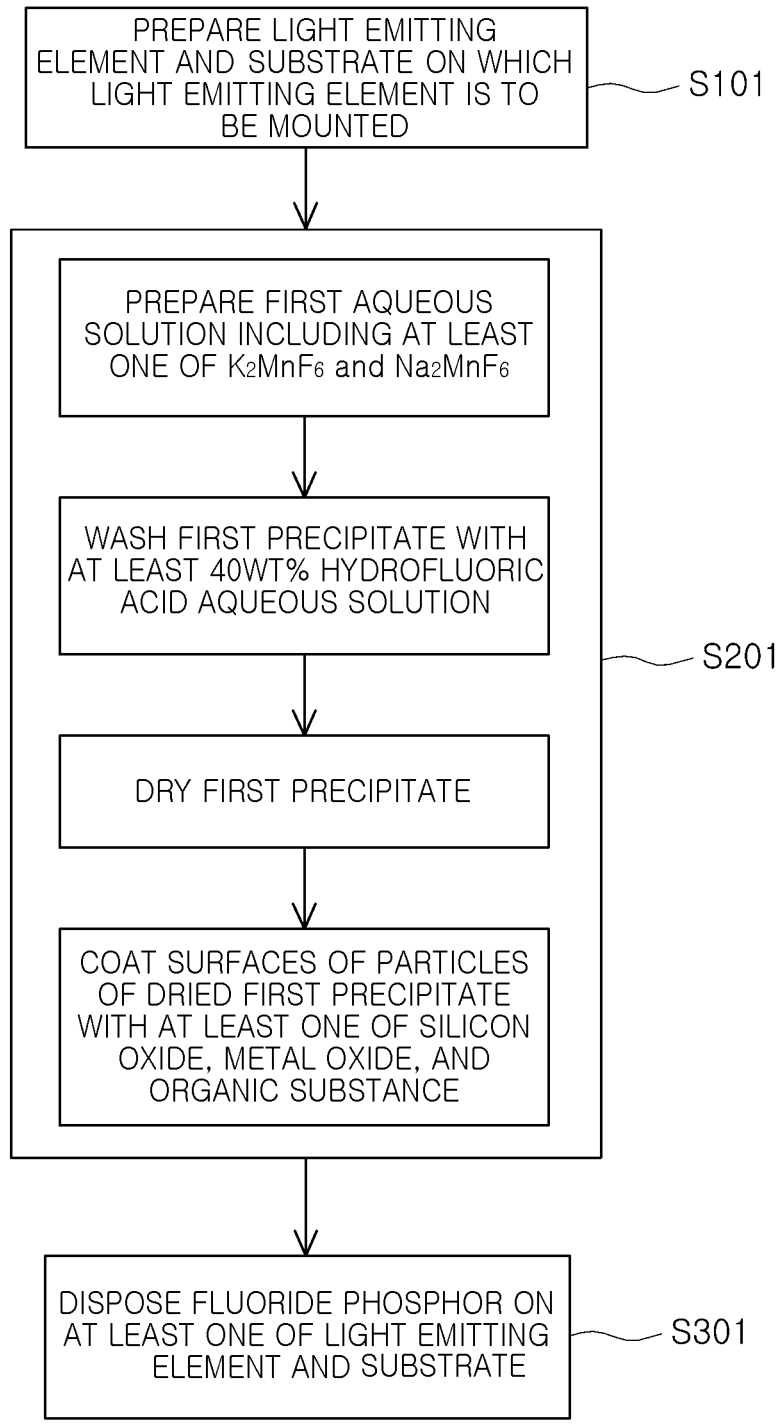
FIGS. 21 through 23 are flow charts illustrating a method of manufacturing a light emitting device according to an exemplary embodiment of the present disclosure.
Figure 22:
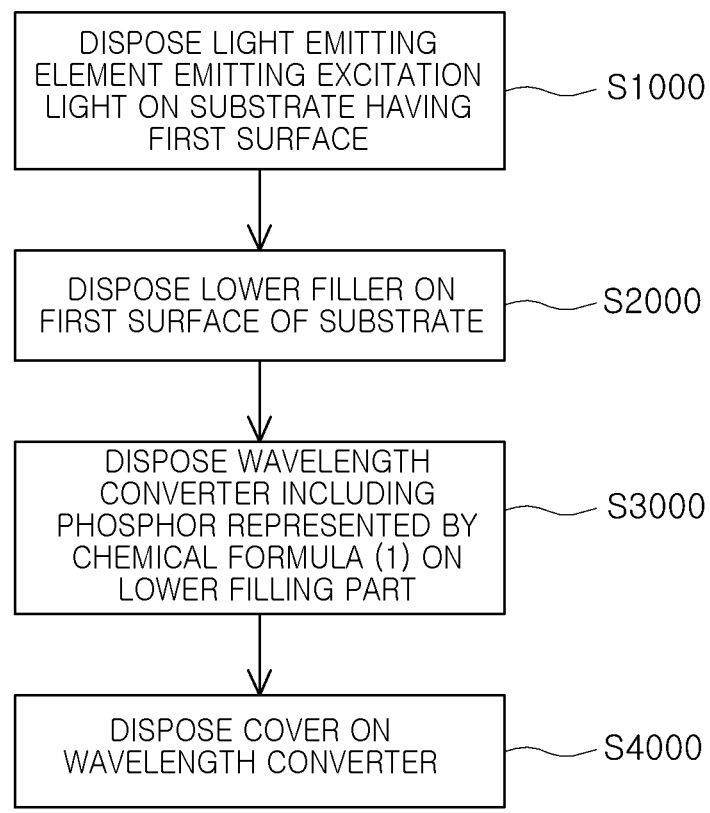
Figure 23:
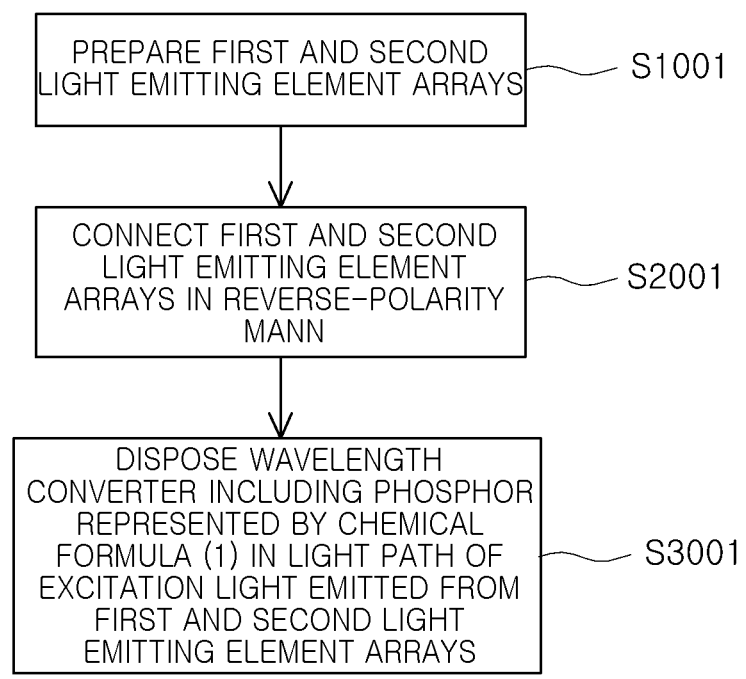

FIGS. 21 through 23 are flow charts illustrating a method of manufacturing a light emitting device according to an exemplary embodiment of the present disclosure.

FIG. 21 is a flow chart illustrating a method of manufacturing a light emitting device according to an exemplary embodiment of the present disclosure.

Referring to FIG. 21, the method of manufacturing a light emitting device according to an exemplary embodiment of the present disclosure may include operation S101 of preparing a light emitting element emitting excitation light and a substrate on which the light emitting element is mounted, operation S201 of preparing a fluoride phosphor represented by Chemical Formula (1), and operation S202 of forming the fluoride phosphor on at least one of the light emitting element and the substrate.

Here, operation S201 of preparing the fluoride phosphor represented by Chemical Formula (1) may include operation of preparing a first aqueous solution including at least one of $K_2MnF_6$ and $Na_2MnF_6$, operation of forming a first precipitate using the first aqueous solution, a first raw material containing M, and a second raw material containing A, operation of drying the first precipitate, and operating of coating surfaces of particles of the dried first precipitate with at least one of a silicon oxide, a metal oxide, and an organic substance.

Like the method of manufacturing a phosphor illustrated in FIG. 10, surfaces of the fluoride phosphor particles applied to the light emitting device according to the exemplary embodiment of FIG. 21 are coated with at least one of a silicon oxide, a metal oxide, and an organic substance, without undergoing an operation of washing with a 40 wt % or more hydrofluoric acid aqueous solution such as in the case of FIG. 19, whereby permeation of ambient moisture may be effectively prevented, obtaining a phosphor having improved reliability which is to be used in the method of manufacturing a light emitting device.

FIG. 22 is a flow chart illustrating a method of manufacturing a light emitting device according to an exemplary embodiment of the present disclosure.

Referring to FIG. 22, the method of manufacturing a light emitting device according to the present exemplary embodiment may include an operation S1000 of disposing a light emitting element emitting excitation light on a substrate having a first surface, an operation S2000 of forming a lower filler on the first surface on which the light emitting element is mounted, an operation S3000 of forming a wavelength converter on the lower filler such that the wavelength converter is separated from the first surface of the substrate by the lower filler, and an operation S4000 of forming a cover on the wavelength converter.

Here, the wavelength converter may be sealed by at least one of the substrate, the lower filler, and the cover.

The wavelength converter may include a fluoride phosphor represented by Chemical Formula (1).

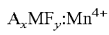$A_xMF_y:Mn^{4+}$ Chemical Formula (1)

(wherein 2≤x≤3 and 4≤y≤7, A is at least one element selected from the group consisting of Li, Na, K, Rb, and Cs, and M is at least one element selected from the group consisting Si, Ti, Zr, Hf, Ge, and Sn).

In this manner, the light emitting device having the configuration as described above with reference to FIGS. 11A through 16 may be obtained. Thus, components, for example, a light emitting device, a substrate, a lower filler, a wavelength converter, and a cover, mentioned in FIG. 22 may refer to relevant contents described above with reference to FIGS. 11A through 16.

FIG. 23 is a flow chart illustrating a method of manufacturing a light emitting device according to an exemplary embodiment of the present disclosure.

Referring to FIG. 23, the method of manufacturing a light emitting device according to the present exemplary embodiment may include operation S1001 of preparing first and second light emitting element arrays emitting excitation light, operation S2001 of connecting the first and second light emitting element arrays in a reverse-polarity manner, operation S3001 of forming a wavelength converter in a light path of the excitation light emitted from the first and second light emitting element arrays, the wavelength converter absorbing the excitation light emitted from the first and second light emitting element arrays to emit visible light. Here, the first and second light emitting element arrays alternately emit light upon receiving external AC power, and the wavelength converter may include a fluoride phosphor represented by Chemical Formula (1).

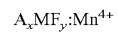$A_xMF_y:Mn^{4+}$ Chemical Formula (1)

(wherein 2≤x≤3 and 4≤y≤7, A is at least one element selected from the group consisting of Li, Na, K, Rb, and Cs, and M is at least one element selected from the group consisting Si, Ti, Zr, Hf, Ge, and Sn).

In this manner, the light emitting device having the configuration as described above with reference to FIGS. 17 and 18 may be obtained. Thus, components, for example, first and second light emitting element arrays, a wavelength converter, and AC power, mentioned in description related to FIG. 23 may be referred to the relevant contents described above with reference to FIGS. 17 and 18.

Figure 24:
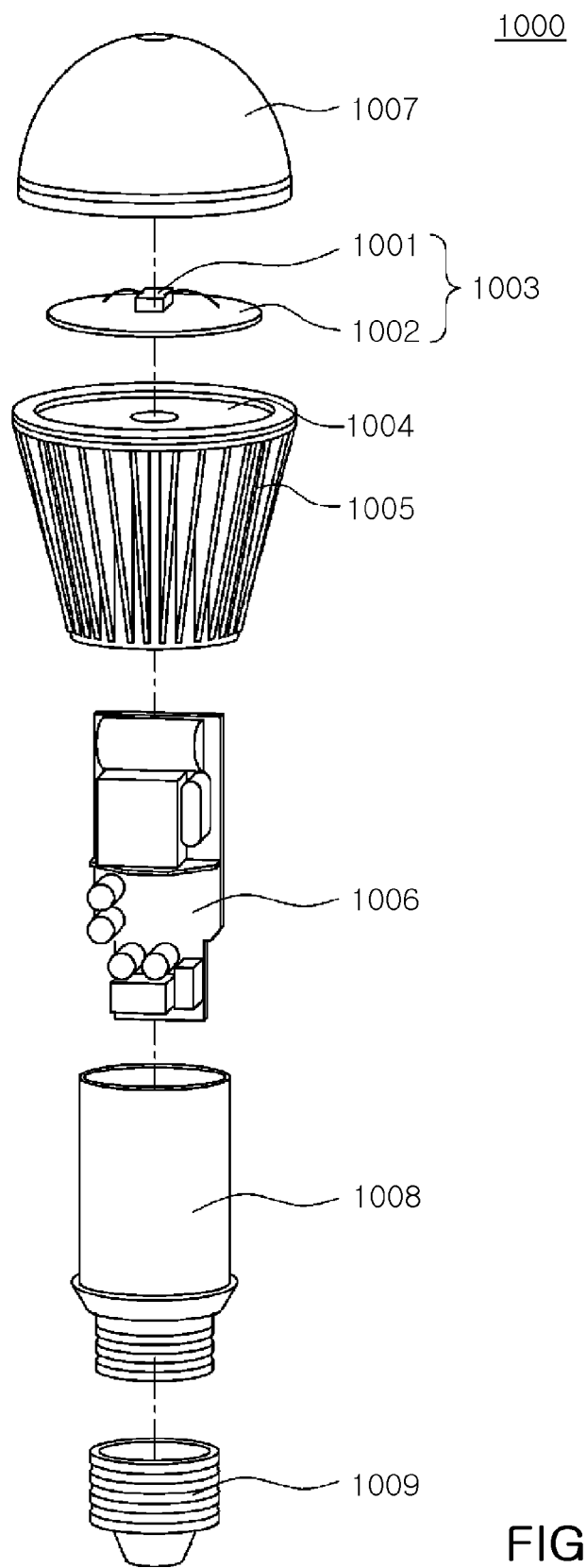
FIGS. 24 and 25 are exploded perspective views illustrating a lighting device employing a light emitting device according to an exemplary embodiment of the present disclosure.
Figure 25:
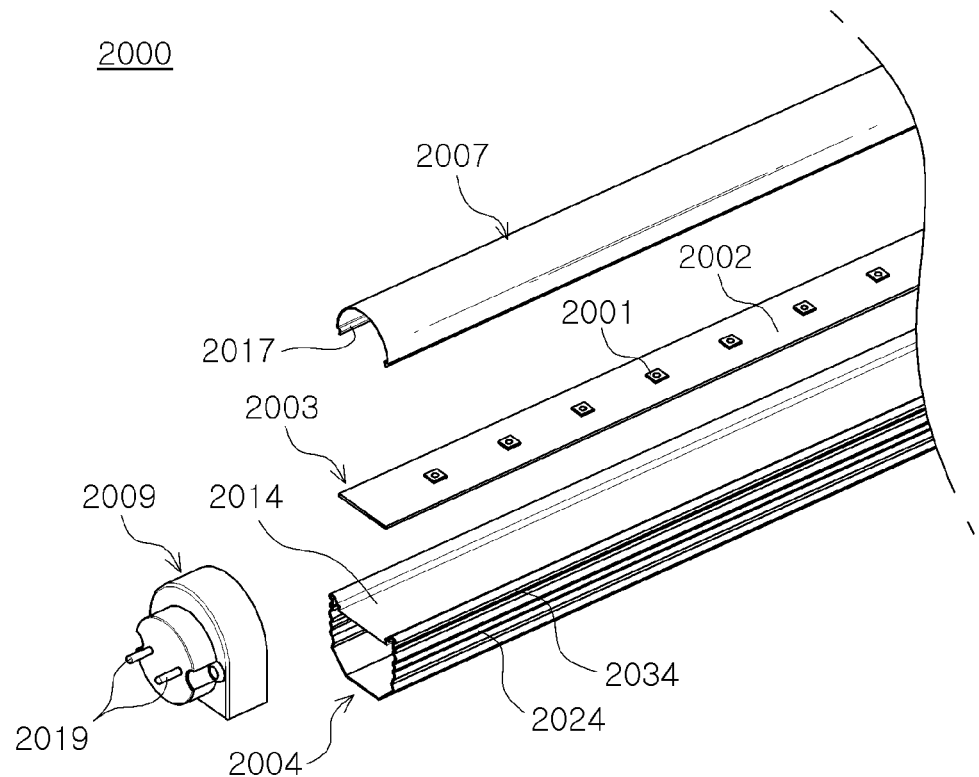

FIGS. 24 and 25 are exploded perspective views illustrating lighting devices 1000 and 2000 employed in a light emitting module according to an exemplary embodiment of the present disclosure.

The lighting device 1000 may be a bulb-type lamp as illustrated in FIG. 24. The lighting device 1000 may have a shape similar to that of an incandescent lamp in order to replace a conventional incandescent lamp and may output light having optical characteristics (e.g., color, color temperature, and the like) similar to those of an incandescent lamp.

Referring to the exploded perspective view of FIG. 24, the lighting device 1000 includes a light source module 1003, a driving unit 1006, and an external connection unit 1009. Also, the lighting device 1000 may further include external structures such as external and internal housings 1005 and 1008 and a cover 1007. The light source module 1003 may include a light source 1001 and a circuit substrate 1002 on which the light source 1001 is mounted. In the present exemplary embodiment, a single light source 1001 is illustrated as being mounted on the circuit substrate 1002, but a plurality of light sources may be mounted as needed. Here, the light source 1001 may be the light emitting device according to the former exemplary embodiment as described above.

In the lighting device 1000, the light source module 1003 may include the external housing 1005 acting as a heat dissipation unit, and the external housing 1005 may include a heat dissipation plate 1004 in direct contact with the light source module 1003 in order to have an enhanced heat dissipation effect. The lighting device 1000 may include the cover 1007 mounted on the light source module 1003 and having a convex lens shape. The driving unit 1006 may be installed in the internal housing 1008 and receive power provided from the external connection unit 1009 having a socket structure. Also, the driving unit 1006 servers to convert power into an appropriate current source for driving the light source 1001 of the light source module 1003 and provide the same. The driving unit 1006 may include a rectifying unit and a DC/DC converter.

The lighting device 2000 may be a bar-type lamp as illustrated in FIG. 25. The lighting device 2000 may have a shape similar to that of a fluorescent lamp to replace the conventional fluorescent lamp, and may output light having optical properties similar to those of a fluorescent lamp.

Referring to the exploded perspective view of FIG. 25, a lighting device 2000 according to the present exemplary embodiment may include a light source module 2003, a body unit 2004, and a terminal unit 2009, and may further include a cover 2007 covering the light source module 2003.

The light source module 2003 may include a substrate 2002, a plurality of light sources 2001 mounted on the substrate 2002. The light sources 2001 may be the light emitting device according to the former exemplary embodiment as described above.

The body unit 2004 may allow the light source module 2003 to be fixedly installed on one surface thereof. The body unit 2004, a type of support structure, may include a heat sink. The body unit 2004 may be formed of a material having excellent heat conductivity to outwardly dissipate heat generated by the light source module 2003. For example, the body unit 2004 may be formed of a metal, but the present disclosure is not limited thereto.

The body unit 2004 may have a generally elongated bar-like shape corresponding to the shape of the substrate 2002 of the light source module 2003. The body unit 2004 may have a recess 2014 formed in one surface thereof to accommodate the light source module 2003 therein.

A plurality of heat dissipation fins 2024 may be protruded from both outer surfaces of the body unit 2004 to dissipate heat. Stoppage grooves 2034 may be formed in both edges of the outer surface positioned above the recess 2014 and extend in a length direction of the body unit 2004. The cover 2007 described below may be fastened to the stoppage grooves 2034.

Both end portions of the body unit 2004 in the length direction thereof may be open, and the body unit 2004 may have a pipe structure with both end portions thereof open. In the present exemplary embodiment, the body unit 2004 is illustrated as having a structure in which both end portions thereof are open, but the present disclosure is not limited thereto. For example, only one of both end portions of the body unit 2004 may be open.

The terminal unit 2009 may be provided in at least open side among both end portions of the body unit 2004 in the length direction to supply power to the light source module 2003. In the present exemplary embodiment, both end portions of the body unit 2004 are open, so the terminal unit 2009 is illustrated as being disposed in both end portions of the body unit 2004. However, the present disclosure is not limited thereto, and when the body unit 2004 has a structure in which only one side thereof is open, the terminal unit 2009 may be provided in the single open end portion among both end portions of the body unit 2004.

The terminal unit 2009 may be fastened to both open end portions of the body unit 2004 in order to cover the open end portions. The terminal unit 2009 may include electrode pins 2019 protruding outwards.

The cover 2007 is fastened to the body unit 2004 to cover the light source module 2003. The cover 2007 may be formed of a material allowing light to be transmitted therethrough.

The cover 2007 may have a semicircular curved surface allowing light to be generally irradiated outwards in a uniform manner. Protrusions 2017 may be formed on a bottom surface of the cover 2007 fastened to the body unit 2004, in a length direction of the cover 2007, and engaged with the stoppage grooves 2034 of the body unit 2004.

In the present exemplary embodiment, the cover 2007 is illustrated as having a semicircular shape, but the present disclosure is not limited thereto. For example, the cover 2007 may have a flat quadrangular shape or may have any other polygonal shape. The shape of the cover 2007 may be variously modified according to an illumination design in which light is irradiated.

Figure 26:
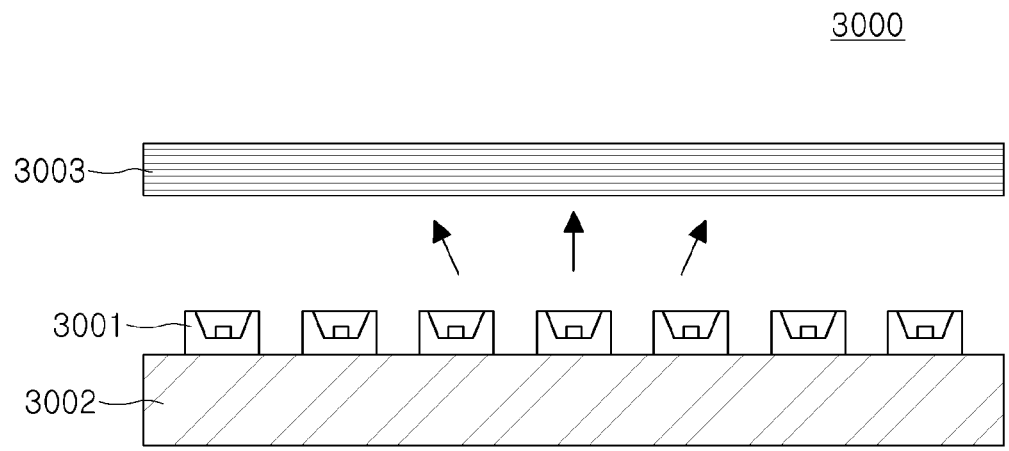
FIGS. 26 and 27 are views illustrating an example of applying a light emitting device according to an exemplary embodiment of the present disclosure to a backlight unit.
Figure 27:
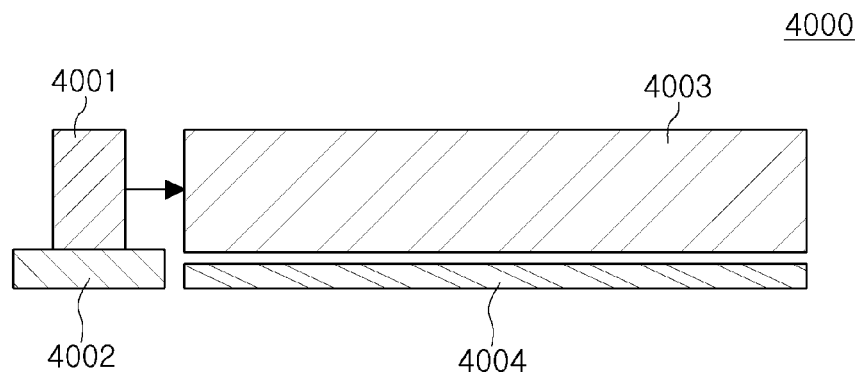

FIGS. 26 and 27 are views illustrating a backlight unit employing a light emitting device according to an exemplary embodiment of the present disclosure.

Referring to FIG. 26, a backlight unit 3000 includes light sources 1001 mounted on a substrate 3002 and one or more optical sheets 3003 disposed above the light sources 3001. As the light source 3001, a light emitting device having the aforementioned structure or a structure similar thereto may be used.

Unlike the backlight unit 3000 in FIG. 26 in which the light sources 3001 emit light toward an upper side on which a liquid crystal display is disposed, a backlight unit 4000 as another example illustrated in FIG. 27 is configured such that light sources 4001 mounted on a substrate 4002 emit light in a lateral direction, and the emitted light may be made to be incident to a light guide plate 4003 so as to be converted into a surface light source. Light, passing through the light guide plate 4003, is emitted upwards, and in order to enhance light extraction efficiency, a reflective layer 4004 may be disposed on a lower surface of the light guide plate 4003. As the light source 4001, a light emitting device having the aforementioned structure or a structure similar thereto may be used.

Figure 28:
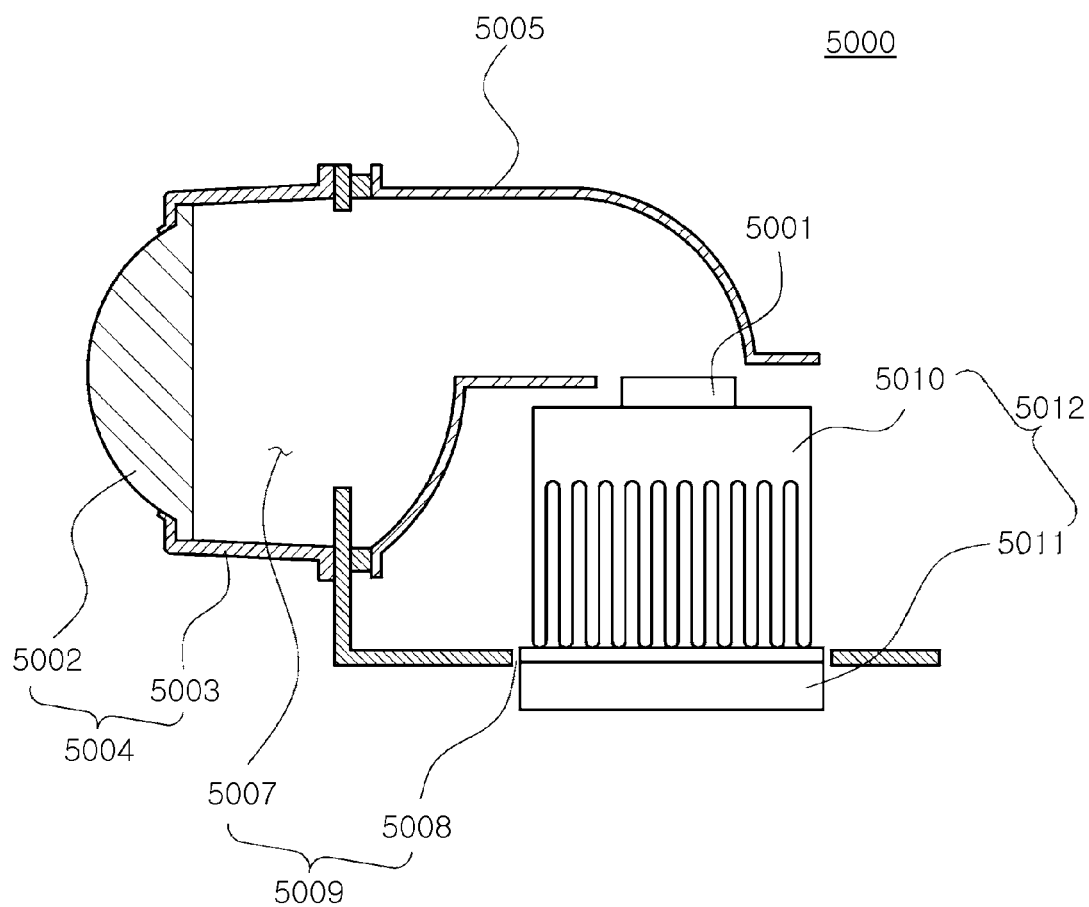
FIG. 28 is a view illustrating an example of applying a light emitting device according to an exemplary embodiment of the present disclosure to a headlamp.

FIG. 28 is a view illustrating a head lamp employing a light emitting device according to an exemplary embodiment of the present disclosure. Referring to FIG. 28, a headlamp 5000 used as a vehicle lamp, or the like, may include a light source 5001, a reflective unit 5005, and a lens cover 5004. The lens cover 5004 may include a hollow guide 5003 and a lens 5002. The headlamp 5000 may further include a heat dissipation unit 5012 outwardly dissipating heat generated by the light source 5001. In order to effectively dissipate heat, the heat dissipation unit 5012 may include a heat sink 5010 and a cooling fan 5011. Also, the headlamp 5000 may further include a housing 5009 fixedly supporting the heat dissipation unit 5012 and the reflective unit 5005, and the housing 5009 may have a central hole 5008 formed in one surface thereof, in which the heat dissipation unit 5012 is coupled. Also, the housing 5009 may have a front hole 5007 formed in the other surface integrally connected to the one surface and bent in a right angle direction. The front hole 5007 may allow the reflective unit 5005 to be fixedly positioned above the light source 5001. Accordingly, a front side is opened by the reflective unit 5005, and the reflective unit 5005 is fixed to the housing 5009 such that the opened front side corresponds to the front hole 5007, and light reflected by the reflective unit 5005 may pass through the front hole 5007 to be output outwardly. In the present exemplary embodiment, the light source 5001 may include the lighting device according to the former exemplary embodiment as described above.

As set forth above, according to exemplary embodiments of the present disclosure, a method of effectively preparing a phosphor having enhanced optical properties and reliability may be provided.

In addition, a light emitting device having excellent color characteristics and a method of manufacturing the same may be obtained by using such a phosphor.

Advantages and effects of the present disclosure are not limited to the foregoing content and any other technical effects not mentioned herein may be easily understood by a person skilled in the art from the foregoing description.

While exemplary embodiments have been shown and described above, it will be apparent to those skilled in the art that modifications and variations could be made without departing from the spirit and scope of the present disclosure as defined by the appended claims.

What is claimed is:

1. A method of manufacturing a light emitting device, the method comprising:
    preparing a light emitting element emitting excitation light and a substrate having a first surface on which the light emitting element is disposed;
    mounting the light emitting element on the first surface of the substrate;
    preparing a fluoride phosphor absorbing excitation light emitted from the light emitting element to emit visible light, represented by Chemical Formula (1):

$A_xMF_y:Mn^{4+}$  Chemical Formula (1):

wherein $2 \leq x \leq 3$ and $4 \leq y \leq 7$, A is at least one element selected from the group consisting of Li, Na, K, Rb, and Cs, and M is at least one element selected from the group consisting Si, Ti, Zr, Hf, Ge, and Sn; and
    disposing the fluoride phosphor on at least one of the light emitting element and the substrate,
    wherein the preparing of the fluoride phosphor represented by the Chemical Formula (1) comprises:
    preparing a first aqueous solution including at least one of $K_2MnF_6$ and $Na_2MnF_6$, the first aqueous solution being a first hydrofluoric acid aqueous solution having at least one of $KMnF_6$ and $NaMnF_6$ dissolved therein;
    forming a first precipitate using the first aqueous solution, a first raw material containing M and a second raw material containing A, by stirring the first raw material in the first hydrofluoric acid aqueous solution and by adding the second raw material to the product generated by the stirring operation to form the first precipitate;
    washing the first precipitate with at least a 40 wt % hydrofluoric acid aqueous solution; and
    drying the washed first precipitate.

2. The method of claim 1, wherein the disposing of the fluoride phosphor on at least one of the light emitting element and the substrate comprises:
    disposing a lower filler on the first substrate of the substrate on which the light emitting element is disposed;
    disposing a wavelength converter on the lower filler such that the wavelength converter is separated from the first surface by the lower filler, the wavelength converter including the prepared fluoride phosphor; and
    disposing a cover on the wavelength converter,
    wherein the wavelength converter is sealed by at least one of the substrate, the lower filler, and the cover.

3. The method of claim 2, wherein the disposing of the cover comprises:
    disposing a first cover on the wavelength converter; and
    disposing a second cover including a resin on the first cover.

4. The method of claim 3, wherein the second cover includes first and second layers having different refractive indices.

5. The method of claim 4, wherein the first layer includes methyl-based silicone, and the second layer includes phenyl-based silicone.

6. The method of claim 1, wherein the preparing of the first aqueous solution comprises:
    dissolving $KHF_2$ powder or $NaHF_2$ powder, and, $KMnO_4$ powder or $NaMnO_4$ powder in the hydrofluoric acid aqueous solution;
    adding hydrogen peroxide to the product generated by the dissolving operation to form a second precipitate; and
    stirring the second precipitate in the hydrofluoric acid aqueous solution to remove the $KHF_2$ powder or $NaHF_2$ powder remaining in the second precipitate.

7. The method of claim 1, wherein the light emitting element includes:
    a first light emitting element and a second light emitting element connected to the first light emitting element in a reverse-polarity manner, and
    the first and second light emitting elements alternately emit light upon receiving external alternating current (AC) power.

* * * * *